United States Patent
Topaloglu et al.

(10) Patent No.: US 10,510,943 B1
(45) Date of Patent: Dec. 17, 2019

(54) STRUCTURE FOR AN ANTENNA CHIP FOR QUBIT ANNEALING

(71) Applicant: International Business Machines Corporation, Armonk, NY (US)

(72) Inventors: Rasit Onur Topaloglu, Poughkeepsie, NY (US); Sami Rosenblatt, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/115,039

(22) Filed: Aug. 28, 2018

(51) Int. Cl.
*H01L 39/24* (2006.01)
*H01L 39/02* (2006.01)
(Continued)

(52) U.S. Cl.
CPC .......... *H01L 39/249* (2013.01); *G06N 10/00* (2019.01); *H01L 27/18* (2013.01); *H01L 39/025* (2013.01);
(Continued)

(58) Field of Classification Search
CPC ...... H01L 39/249; H01L 27/18; H01L 39/025
See application file for complete search history.

(56) References Cited

U.S. PATENT DOCUMENTS

| | | |
|---|---|---|
| 6,960,780 B2 | 11/2005 | Blais et al. |
| 7,893,708 B2 | 2/2011 | Baumgardner et al. |

(Continued)

FOREIGN PATENT DOCUMENTS

| | | |
|---|---|---|
| WO | 2017047380 A1 | 3/2017 |
| WO | 2017078735 A1 | 5/2017 |

(Continued)

OTHER PUBLICATIONS

Patra Bishnu, et al. "Cryo-CMOS Circuits and Systems for Quantum Computing Applications." IEEE Journal of Solid-State Circuits. 2018. 13 pages.

(Continued)

*Primary Examiner* — Farun Lu
(74) *Attorney, Agent, or Firm* — Amin, Turocy & Watson, LLP

(57) ABSTRACT

Systems and techniques providing suitable chip structures for facilitating antenna-based thermal annealing of qubits are provided. In one example, a radio frequency emitter can comprise a voltage-controlled oscillator and an antenna. The voltage-controlled oscillator can receive power-on signals from a microcontroller, thereby causing the voltage-controlled oscillator to generate an electromagnetic wave. The antenna can then direct the electromagnetic wave onto a set of one or more capacitor pads of a Josephson junction on a superconducting qubit chip, thereby annealing the Josephson junction. In another example, a voltage regulator and a digital-to-analog converter or digital-to-digital converter can be coupled in series between the microcontroller and the voltage-controlled oscillator, thereby allowing the voltage-controlled oscillator to be voltage and/or frequency tunable and eliminating the need for external power routing as compared to photonic laser annealing. In yet another example, a bipolar-junction and complementary metal-oxide semiconductor stack construction can be employed.

10 Claims, 20 Drawing Sheets

(51) Int. Cl.
*H01L 39/22* (2006.01)
*G06N 10/00* (2019.01)
*H01L 27/18* (2006.01)

(52) U.S. Cl.
CPC ........ *H01L 39/223* (2013.01); *H01L 39/2493* (2013.01)

(56) References Cited

U.S. PATENT DOCUMENTS

| | | | |
|---|---|---|---|
| 8,193,808 | B2 | 5/2012 | Fu et al. |
| 8,633,472 | B2 | 1/2014 | Boulaevskii et al. |
| 8,922,239 | B2 | 12/2014 | Pesetski et al. |
| 9,607,270 | B2 | 3/2017 | Harris et al. |
| 9,685,935 | B2 | 6/2017 | Strand et al. |
| 9,934,468 | B2 | 4/2018 | Mohseni et al. |
| 2012/0075158 | A1 | 3/2012 | Kawahata |
| 2016/0336646 | A1* | 11/2016 | Baek ................ H01Q 1/243 |
| 2017/0092834 | A1 | 3/2017 | Fong et al. |
| 2017/0155361 | A1 | 6/2017 | Suzuki et al. |
| 2017/0300827 | A1 | 10/2017 | Amin |
| 2018/0013052 | A1* | 1/2018 | Oliver ................ H01L 25/0657 |
| 2018/0054201 | A1 | 2/2018 | Reagor et al. |
| 2018/0013426 | A1 | 6/2018 | Deurloo et al. |

FOREIGN PATENT DOCUMENTS

| | | |
|---|---|---|
| WO | 2017105429 A1 | 6/2017 |
| WO | 2017139683 A1 | 8/2017 |
| WO | 2018063206 A1 | 4/2018 |

OTHER PUBLICATIONS

"Digital Adjustment of DC-DC Converter Output Voltage in Portable Applications." Maxim Integrated. Last Accessed Jul. 30, 2018. 13 pages. https://www.maximintegrated.com/en/app-notes/index.mvp/id/818.

Brecht, Teresa, et al."Multilayer microwave integrated quantum circuits for scalable quantum computing." npj Quantum Information, 2, p. 16002. Feb. 23, 2016. 4 pages.

Tan, Yanghong, et al. "Automatic impedance matching and antenna tuning using quantum genetic algorithms for wireless and mobile communications." IET Microwaves, Antennas & Propagation, 7(8), pp. 693-700. 2013. 8 pages.

Bredendiek, Christian, et al. "Differential Signal Source Chips at 150 GHz and 220 GHz in SiGe Bipolar Technologies Based on Gilbert-Cell Frequency Doublers." Bipolar/BiCMOS Circuits and Technology Meeting (BCTM), 2012 IEEE. 4 pages.

Liu, W.Y., et al. "Superconducting quantum bits." Chinese Physics B, 27(2), p. 027401. 12 pages.

List of IBM Patents or Applications Treated as Related.

* cited by examiner

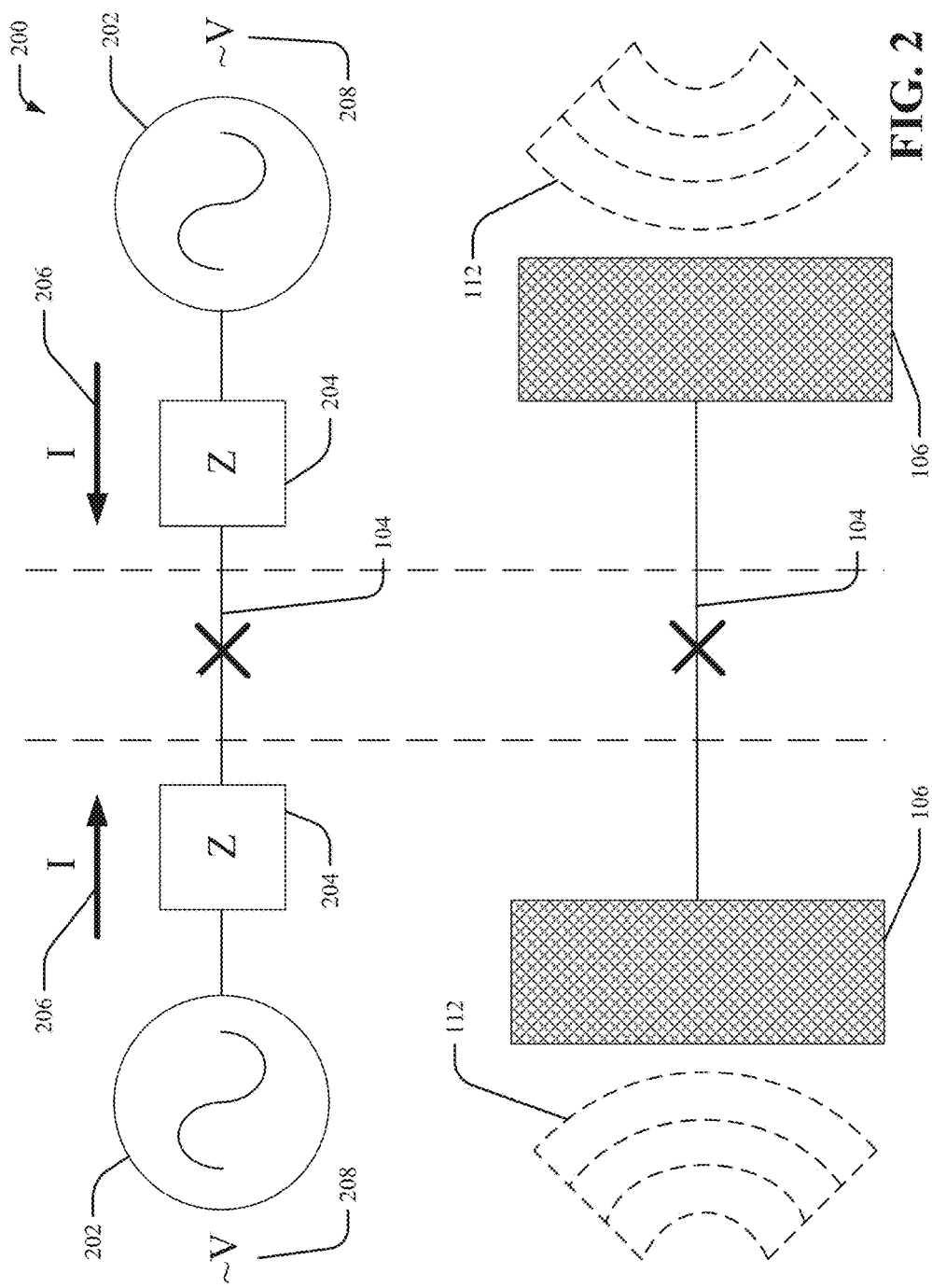

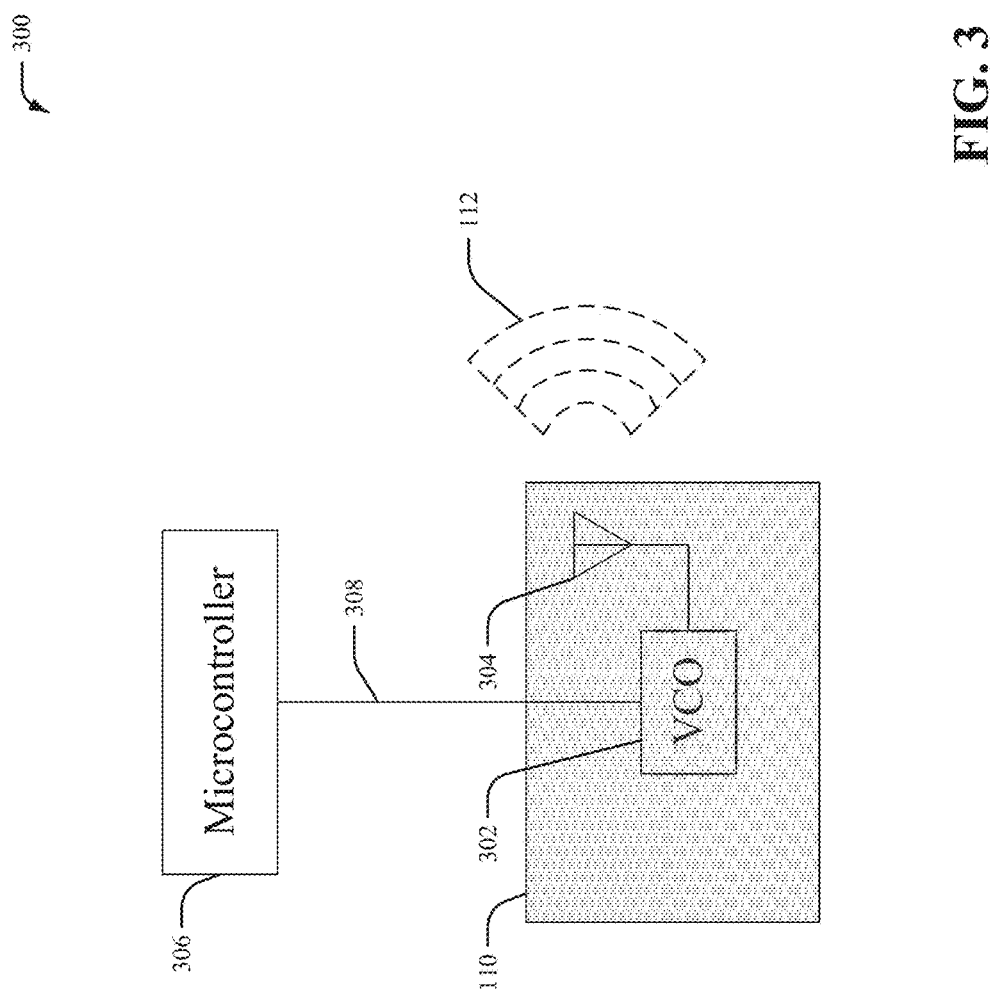

STRUCTURE FOR AN ANTENNA CHIP FOR QUBIT ANNEALING

BACKGROUND

The subject disclosure relates to qubit annealing, and more specifically, to a structure of a chip for facilitating qubit annealing with antennas. The qubit (e.g., quantum binary digit) is the quantum-mechanical analogue of the classical bit. Whereas classical bits can take on only one of two basis states (e.g., 0 or 1), qubits can take on superpositions of those basis states (e.g., $\alpha|0\rangle + \beta|1\rangle$, where $\alpha$ and $\beta$ are complex scalars such that $|\alpha|^2 + |\beta|^2 = 1$), allowing a number of qubits to theoretically hold exponentially more information than the same number of classical bits. Thus, quantum computers (e.g., computers that employ qubits instead of solely classical bits) can, in theory, quickly solve problems that would be extremely difficult for classical computers. The efficacy of quantum computers can be improved by improving the fabrication and processing of multi-qubit chips. Due to the phenomenon of frequency collision and/or quantum cross-talk (e.g., multiple neighboring qubits having too similar resonant frequencies such that they have undesired interactions with each other), the ability to precisely tune and/or alter qubit frequencies is paramount in the construction of multi-qubit chips. Traditional solutions for such frequency control include tuning of variable-frequency qubits and thermal annealing of fixed-frequency qubits. Variable-frequency qubits have resonant frequencies that can be tuned by exposure to external magnetic fields; however, the additional tuning circuitry required on the qubit chip adds unnecessary complexity and noise. Thermal annealing of fixed-frequency qubits, which involves heating a qubit so as to change its physical properties (e.g., resonant frequency), does not introduce such noise during qubit operation (which is realized at cryogenic temperatures compatible with the superconducting regime). Traditionally, thermal annealing of qubits has been performed by using a photonic chip with a laser source physically routed to different locations on the photonic chip via Mach-Zehnder switches (realized at room temperature or at temperatures outside the superconducting regime). Although parallel annealing of multiple qubits on a multi-qubit chip is possible with such a system, the maximum laser power (e.g., and thus the maximum annealing capability) at each location on the photonic chip depends on the amount of power routed to the other locations on the chip (e.g., if more power from the laser source is routed to location 1, less power from the laser source is available to be simultaneously routed to location 2). Thus, traditional laser annealing of qubits is best suited to serial annealing rather than concurrent/parallel annealing of qubits. Therefore, traditional qubit annealing cannot facilitate independent and/or concurrent localized annealing of one or more qubits on a multi-qubit chip.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatus and/or computer program products that facilitate antenna-based qubit annealing are described.

According to one or more embodiments, a system can comprise a superconducting qubit chip having a first qubit with a first Josephson junction and a first set of one or more capacitor pads. The system can also include a semiconductor chip positioned above the superconducting qubit chip. A first radio frequency (RF) emitter can be on the semiconductor chip. The first RF emitter can itself comprise a first voltage-controlled oscillator and a first antenna driven by the first voltage-controlled oscillator. Furthermore, the system can have a microcontroller on the semiconductor chip. The microcontroller can signal the first voltage-controlled oscillator to generate a first electromagnetic wave. The first antenna can then direct the first electromagnetic wave toward the first set of one or more capacitor pads of the first qubit. This can cause annealing of the first Josephson junction of the first qubit. An advantage provided by these one or more embodiments is the provision of a chip structure to facilitate a new technique of thermally annealing one or more qubits (e.g., via antenna-based electromagnetic waves, instead of photonic lasers) that leverages the existing quantum circuitry on the superconducting qubit chip (e.g., anneals qubits without having to modify the existing structure/circuitry of the qubit or qubit chip). Optionally, in one or more embodiments, the system can comprise a second RF emitter on the semiconductor chip, including a second voltage-controlled oscillator and a second antenna. The microcontroller can signal the second RF emitter to generate and direct a second electromagnetic wave toward a second set of one or more capacitor pads of a second qubit on the superconducting qubit chip. This can anneal a second Josephson junction of the second qubit. An advantage of these one or more embodiments is to facilitate independent and/or concurrent (or sequential) localized annealing of multiple qubits on a multi-qubit chip (e.g., annealing more than one qubit on the same chip simultaneously and independently, such that each qubit can achieve a distinct level of annealing that can be different from the levels of annealing of neighboring qubits), thereby expediting the overall annealing process to save time as compared to serial annealing, as well as improving frequency allocation and reducing quantum cross-talk. An additional advantage of these one or more embodiments is to eliminate the need for power routing. Specifically, since both the first and second voltage-controlled oscillators can be individually and independently power-regulated (e.g., by being outfitted with voltage regulators, unlike traditional photonic laser sources), power dissipation by one oscillator does not limit power dissipation by the other. Optionally, in one or more embodiments, the semiconductor chip can employ a bipolar-junction and complementary metal-oxide semiconductor stack construction. In various embodiments, the first voltage-controlled oscillator can be fabricated in a bipolar-junction transistor portion of the semiconductor chip. The microcontroller can be fabricated in a complementary metal-oxide semiconductor portion of the semiconductor chip. Moreover, the first antenna can be fabricated in a top far-back-end-of-line portion of the semiconductor chip. An advantage of these one or more embodiments is to facilitate the reliable implementation of both high-frequency electrical components (e.g., the first voltage-controlled oscillator) and digital logic circuitry (e.g., the microcontroller) on the same semiconductor chip.

According to one or more embodiments, a computer-implemented method can comprise sending, by a microcontroller operatively coupled to a processor, a first power-on signal to a first voltage-controlled oscillator. The computer-implemented method can also include generating, by the first voltage-controlled oscillator, a first electromagnetic wave based on the first power-on signal. Moreover, the computer-implemented method can comprise annealing a first Josephson junction of a first qubit. This can be facilitated by directing, via a first antenna, the first electromagnetic wave toward a first set of one or more capacitor pads of the first qubit. This can heat the first Josephson junction of the first qubit, which can be located on a superconducting qubit chip. An advantage of these one or more embodiments is to facilitate a new technique of thermally annealing qubits that leverages existing quantum circuitry on the superconducting qubit chip. Optionally, in one or more embodiments, the computer-implemented method can further comprise sending, by the microcontroller, a second power-on signal to a second voltage-controlled oscillator. The method can further include generating, by the second voltage-controlled oscillator, a second electromagnetic wave based on the second power-on signal. Furthermore, the method can comprise annealing a second Josephson junction of a second qubit. This can be facilitated by directing, via a second antenna, the second electromagnetic wave toward a second set of one or more capacitor pads of the second qubit. This can heat the second Josephson junction of the second qubit, which can be located on the superconducting qubit chip. An advantage of these one or more embodiments is to facilitate independent and concurrent (or sequential) localized annealing of multiple qubits on a multi-qubit chip (e.g., simultaneously annealing more than one qubit on a multi-qubit chip, such that each qubit on the chip achieves a distinct level of annealing, and such that the distinct levels of annealing of the various qubits on the chip can be different). An additional advantage of these one or more embodiments is to eliminate the need for power routing. Again, since the first and second voltage-controlled oscillators can each be independently/individually power-regulated (e.g., outfitted with a voltage regulator), power dissipation by one oscillator does not negatively impact power dissipation by the other. Optionally, in one or more embodiments, the first voltage-controlled oscillator, the first antenna, and the microcontroller can be on a semiconductor chip that can employ a bipolar-junction and complementary metal-oxide semiconductor stack construction. Again, an advantage of these one or more embodiments is to facilitate the implementation of both high-frequency electrical components and digital logic circuitry on the same semiconductor chip.

According to one or more embodiments, a device can comprise a superconducting qubit chip having one or more qubits with one or more Josephson junctions and one or more sets of one or more capacitor pads. The device can also comprise a microcontroller to control annealing of the one or more Josephson junctions of the one or more qubits. The device can further include one or more voltage-controlled oscillators that receive power-on or power-off signals from the microcontroller. Moreover, the device can comprise one or more antennas. In various embodiments, the microcontroller can signal the one or more voltage-controlled oscillators to cause the one or more voltage-controlled oscillators to generate one or more electromagnetic waves. The one or more antennas can then direct the one or more electromagnetic waves toward the one or more sets of one or more capacitor pads of the one or more qubits. This can anneal the one or more Josephson junctions of the one or more qubits. An advantage of these one or more embodiments is to facilitate a new technique of qubit annealing that obviates the need to retrofit/alter the existing quantum circuitry on a superconducting qubit chip and that allows for multiple qubits on the superconducting qubit chip to be concurrently/simultaneously annealed, thereby saving time as compared to serial annealing. An additional advantage of these one or more embodiments is the elimination of the need for power routing (e.g., since each oscillator can be outfitted with a voltage regulator so as to be independently power-regulated). Optionally, in one or more embodiments, the one or more voltage-controlled oscillators can be independently voltage and frequency tunable. An advantage of these one or more embodiments is to facilitate independent and concurrent annealing of multiple qubits on a superconducting qubit chip based on each qubit's unique annealing requirements.

According to one or more embodiments, a computer-implemented method can comprise sending, by a microcontroller of a system, one or more power-on signals to one or more voltage-controlled oscillators of the system. The computer-implemented method can also include generating, by the one or more voltage-controlled oscillators, one or more electromagnetic waves based on the one or more power-on signals. Additionally, the computer-implemented method can comprise annealing one or more Josephson junctions by directing, via one or more antennas of the system, the one or more electromagnetic waves toward the one or more Josephson junctions, thereby heating the one or more Josephson junctions. An advantage of these one or more embodiments is to facilitate concurrent (or sequential) annealing of multiple qubits on a multi-qubit chip without having to otherwise alter the existing quantum circuitry on the multi-qubit chip, as well as eliminating the need for power routing (e.g., since each oscillator can be outfitted with a voltage regulator so as to be individually power-regulated). Optionally, in one or more embodiments, the one or more voltage-controlled oscillators can be individually voltage and frequency tunable. An advantage of these one or more embodiments is to facilitate independent and concurrent (or sequential) localized annealing of multiple qubits on a multi-qubit chip, such that each qubit can be annealed according to its unique annealing requirements.

According to one or more embodiments, an apparatus can comprise a superconducting qubit chip having one or more qubits with one or more Josephson junctions. The device can also comprise a microcontroller to control annealing of the one or more Josephson junctions of the one or more qubits. The device can further include a voltage-controlled oscillator driven by the microcontroller. In some embodiments, the apparatus can comprise a multiplexer or demultiplexer coupled to the voltage-controlled oscillator. Moreover, the apparatus can have one or more antennas. In various embodiments, the microcontroller can signal the voltage-controlled oscillator to generate an electromagnetic wave. The electromagnetic wave can be fed by the demultiplexer to the one or more antennas. The one or more antennas can then direct the electromagnetic wave toward the one or more Josephson junctions of the one or more qubits. This can anneal the one or more Josephson junctions of the one or more qubits. An advantage of these one or more embodiments is to eliminate the need to have a dedicated voltage-controlled oscillator for each of the one or more antennas.

DESCRIPTION OF THE DRAWINGS

FIG. 2 illustrates an equivalent circuit diagram of an example, non-limiting system that facilitates antenna-based qubit annealing in accordance with one or more embodiments described herein.

FIG. 3 illustrates a schematic of an example, non-limiting system that facilitates antenna-based qubit annealing via a voltage-controlled oscillator in accordance with one or more embodiments described herein.

DETAILED DESCRIPTION

Figure 1A:
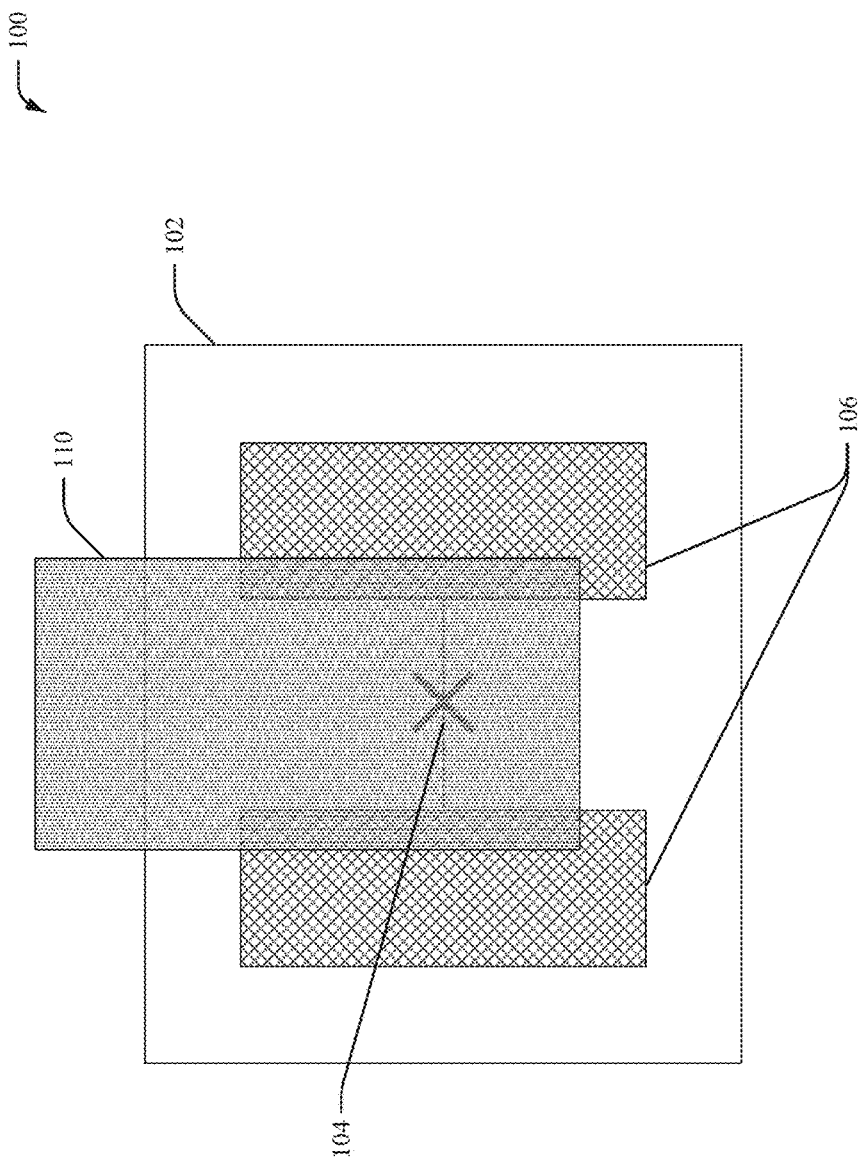
FIGS. 1A and 1B respectively illustrate a top-view schematic and a side-view schematic of an example, non-limiting system that facilitates antenna-based qubit annealing in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Superconducting qubits offer a promising path toward constructing fully-operational quantum computers. This is because they can exhibit quantum-mechanical behavior (allowing them to be used for quantum information processing) at the macroscopic level (allowing them to be designed and fabricated by existing integrated circuit technologies). The fundamental building-block of superconducting qubits is the Josephson junction. Josephson junctions can be formed by sandwiching a non-superconducting material between two superconducting materials, and can be modified by thermal annealing (e.g., heat treating). The annealing of a qubit (e.g., annealing a qubit's Josephson junction) can change a transition frequency of the qubit (e.g., a resonant frequency marking the transition between a qubit's ground state and an excited state). Such manipulation of qubit transition frequencies can enable optimized frequency allocation, thereby minimizing frequency collisions and/or quantum cross-talk. For example, multiple qubits on a multi-qubit chip can be individually/independently annealed such that each qubit has a distinct transition frequency from those of its neighboring qubits, thereby decreasing the likelihood of neighboring qubits inappropriately responding to a computational and/or control signal meant to induce a response in only a certain qubit. Concurrent and localized annealing of qubits would thus benefit the operation of multi-qubit chips. However, a problem in the prior art is that there is no known scalable method/system and/or chip structure for performing such concurrent and localized qubit annealing to modify qubit frequencies.

Various embodiments of the present invention can provide solutions to this problem in the art. One or more embodiments described herein include systems, computer-implemented methods, apparatus, and/or computer program products that provide suitable chip structures to facilitate concurrent and localized qubit annealing. More specifically, one or more embodiments pertaining to chip structures for concurrent and/or localized qubit-annealing using voltage-controlled oscillators and antennas are described. For example, in one or more embodiments, a radio frequency (RF) emitter can emit an electromagnetic signal onto a set of one or more capacitor pads of a Josephson junction, wherein the Josephson junction is a component of a qubit on a superconducting qubit chip. The set of one or more capacitor pads can receive the electromagnetic signal; that is, each pad can function as a receiving antenna (e.g., a patch antenna). Based on receipt by the set of one or more capacitor pads, the electromagnetic signal can induce an alternating current and/or voltage in the set of one or more capacitor pads and/or at or within a defined distance from the Josephson junction (e.g., in the circuit lines electrically coupling the pads to the Josephson junction). This alternating current/voltage can heat the Josephson junction. Such heating can affect the properties of the Josephson junction, thereby modifying a transition frequency of the qubit. To facilitate this annealing, the RF emitter can comprise a voltage-controlled oscillator and an antenna. The voltage-controlled oscillator can create a controllable alternating current/voltage, and the antenna can propagate that alternating current/voltage through space/air as the electromagnetic signal/wave. Furthermore, the RF emitter can be controlled by a microcontroller. In such case, the microcontroller can send power-on and/or power-off signals to the voltage-controlled oscillator to control the duration of the electromagnetic signal. Additionally, the microcontroller can send variable signals (e.g., analog, pulse-width modulated, or multi-bit digital signals) to a voltage regulator which can then send the variable signals (or voltages based on the variable signals) to the voltage-controlled oscillator, so as to control a magnitude and/or frequency of the electromagnetic signal generated by the voltage-controlled oscillator. The inclusion of such regulators can make the voltage-controlled oscillator individually power-regulated, which eliminates the need for power routing if multiple oscillators are used. Other electrical components can also be incorporated to help control the RF emitter (e.g., digital-to-analog converters, digital-to-digital converters, low-noise amplifiers, RF filters, and so on). Moreover, these components can be incorporated into a semiconductor chip employing a bipolar-junction and complementary metal-oxide semiconductor stack construction. Thus, localized qubit annealing can be performed without having to add and/or subtract circuitry to/from the superconducting qubit chip. In one or more other embodiments, multiple electromagnetic emitters can be implemented concurrently so as to perform localized annealing of multiple qubits simultaneously. Thus, various embodiments of the present invention can address problems in the art by facilitating independent and concurrent localized annealing of one or more qubits on a multi-qubit chip without requiring external power routing.

The embodiments described herein relate to systems, computer-implemented methods, apparatus, and/or computer program products that employ highly technical hardware and/or software to technologically solve technological problems in the field of qubit annealing (e.g., thermal annealing of qubits).

Specifically, the field of qubit annealing (which is entirely distinct and separate from the field of quantum annealing) suffers from a lack of scalable and efficient systems and/or computer-implemented methods for individually, independently, and/or concurrently annealing one or more superconducting qubits on a superconducting qubit chip. As described thoroughly below, one or more embodiments of the present invention can address this technical problem by providing a scalable and efficient system and/or computer-implemented method that utilizes a microcontroller to control one or more electromagnetic transmitters, each transmitter having a voltage-controlled oscillator and an antenna. The transmitters can excite sets of one or more capacitor pads of one or more superconducting qubits on a superconducting qubit chip by emitting electromagnetic radiation (e.g. an electromagnetic wave/signal) onto the capacitor pads of a qubit, thereby heating (and therefore annealing) the qubit.

In one or more embodiments, one or more emitters/transmitters can correspond in a one-to-one fashion to one or more qubits on the superconducting qubit chip, wherein each emitter can be driven by an individually and/or independently voltage and/or frequency tunable voltage-controlled oscillator. That is, each emitter can be controlled so as to manipulate a duration, a frequency, and/or a magnitude of the electromagnetic wave/signal that it can generate. Each wave/signal can then induce a distinct amount of annealing of the qubit onto which it is emitted. So, each qubit can be individually and/or independently annealed (e.g., by adjusting the voltage and/or frequency of its corresponding oscillator/antenna) such that it receives a unique and/or defined level of annealing as compared to its neighboring qubits on the superconducting qubit chip. In other words, each of the qubits can achieve a defined level of annealing via the systems and/or computer-implemented methods disclosed herein. For example, one or more embodiments can facilitate annealing a first qubit by a first electromagnetic signal for a first time period, and annealing a second qubit by a second electromagnetic signal for a second time period, wherein the two time periods can be of the same length and/or of different lengths, and/or wherein the two signals can be of the same frequencies, wavelengths, and/or magnitudes and/or of different frequencies, wavelengths, and/or magnitudes. Moreover, the one or more emitters can operate concurrently, thereby facilitating independent and/or concurrent localized annealing of the one or more qubits (e.g., annealing a first qubit for a first time period, and annealing a second qubit for a second time period, wherein the two time periods can be overlapping and/or non-overlapping). Such concurrent and localized annealing addresses problems in the prior art by saving time as compared to serial annealing and improving operation/functionality of multi-qubit chips by eliminating frequency collisions and/or quantum crosstalk.

Not only can the disclosed systems and/or computer-implemented methods efficiently and precisely anneal superconducting qubits individually and concurrently, but they can also do so without having to change, modify, and/or otherwise adapt the quantum circuitry of the qubits and/or the superconducting qubit chip. For example, there is no need to physically solder, build through a manufacturing process, couple, and/or etch extra capacitors, inductors, resistors, and/or any other circuitry to the qubit to be annealed. Instead, one or more embodiments disclosed herein can facilitate qubit annealing by leveraging the existing quantum circuitry on the superconducting qubit chip (e.g., emitting electromagnetic waves/signals onto existing capacitor pads that are already coupled to a Josephson junction). Thus, the prior art problem of having to incorporate additional tuning circuitry to tune qubit frequencies can be eliminated.

Additionally, because each RF emitter can include a tunable voltage-controlled oscillator and can further be outfitted with a voltage regulator, each RF emitter can likewise be both regulated and tunable. Because each RF emitter can be individually power-regulated, various embodiments of the present invention do not require power routing (e.g., splitting incoming power/energy among several parallel instruments, such that one instrument's power usage reduces the amount of power available for the other instruments). In contrast, the traditional method of laser annealing via Mach-Zehnder switches does require such routing (e.g., such that increased power usage/dissipation by one laser location reduces the total amount of power that can be routed to other laser locations). So, each RF emitter, in various embodiments, can have an individually regulated power supply/range based on its target qubit's individual annealing requirements, such that power usage/dissipation by one oscillator/emitter does not negatively affect or limit power usage/dissipation by another oscillator/emitter. Therefore, there is no need to route the external power supply, unlike in traditional laser annealing. Thus, the prior art problem of necessitated power routing can be eliminated.

The above-mentioned technical improvements, which are more thoroughly described below, are not abstract, are not merely laws of nature or natural phenomena, and cannot be performed by humans without the use of specialized, specific, and concrete hardware and/or software (e.g., voltage-controlled oscillators, antennas, voltage regulators, microcontrollers, and so on).

Figure 1B:
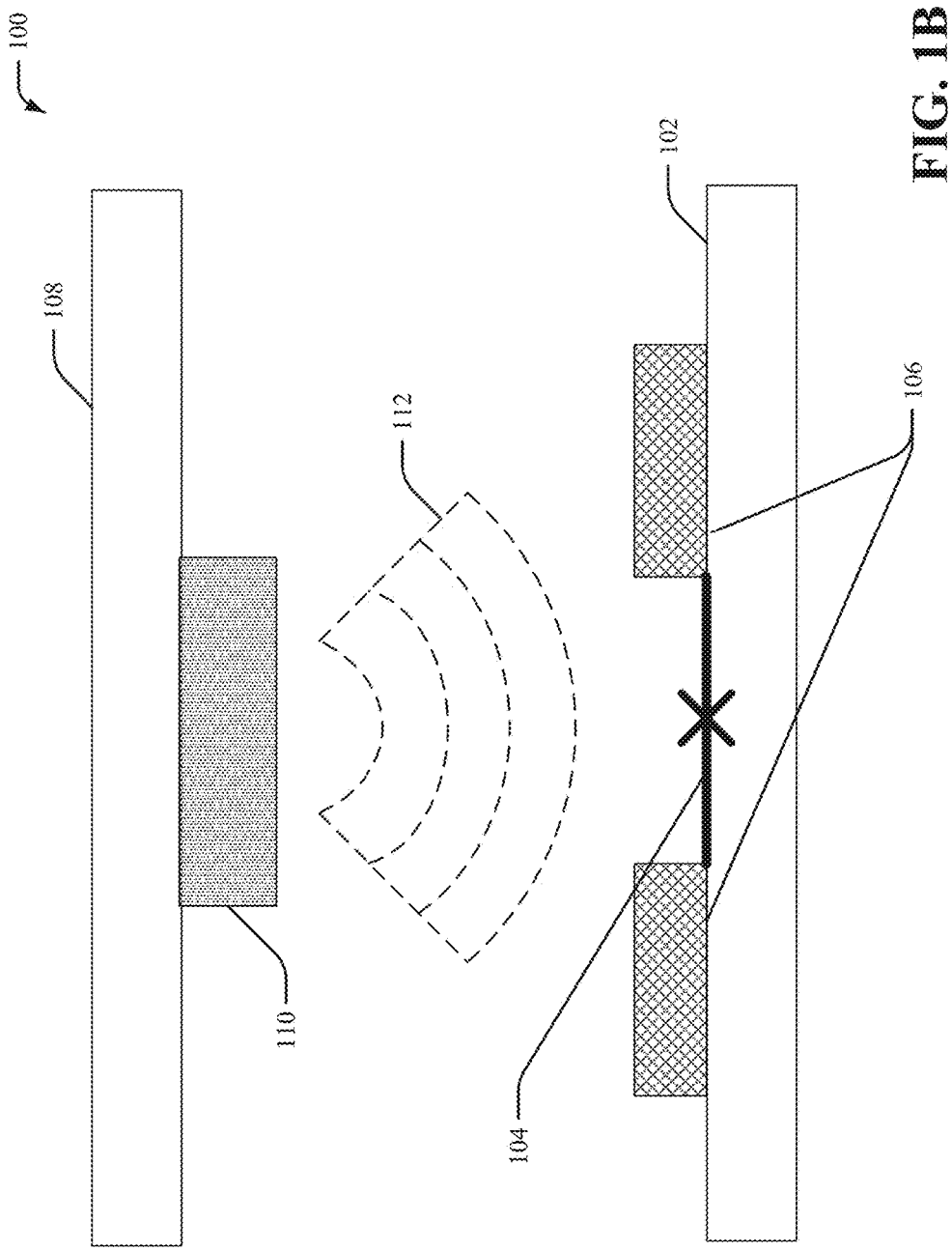

Now, consider the drawings. FIGS. 1A and 1B respectively illustrate a top-view schematic and a side-view schematic of an example, non-limiting system that facilitates antenna-based qubit annealing in accordance with one or more embodiments described herein. With reference now to FIGS. 1A and 1B, there is illustrated an example system 100 that can facilitate antenna-based qubit annealing of qubits on a superconducting qubit chip 102. In various embodiments, the system 100 can be used to facilitate antenna-based annealing of qubits/Josephson junctions on the superconducting qubit chip 102 regardless of the fabrication stage of the qubits/Josephson junctions (e.g., post-fabrication, pre-fabrication, and/or mid-fabrication processing/annealing of the qubits/Josephson junctions). For example, the superconducting qubit chip 102 can be fully etched/outfitted with qubits, quantum readout resonators, and/or other quantum circuitry such that the superconducting qubit chip 102 is fully-fabricated and ready to be implemented in a quantum computer once a defined level of annealing is accomplished. In other embodiments, the qubits/Josephson junctions on the superconducting qubit chip 102 can undergo additional fabrication/processing after being annealed by the system 100. In still other embodiments, the system 100 can be incorporated into a dedicated qubit-production and/or Josephson-junction-production process, wherein the superconducting qubit chip 102 is a dedicated platform/substrate on which one or more qubits/Josephson junctions are constructed, wherein the qubits/Josephson junctions are removed from the superconducting qubit chip 102 after annealing to be incorporated into other quantum computing chips.

In one or more embodiments, the superconducting qubit chip 102 can be a printed circuit board comprising one or more sheets/layers of conducting material (e.g., such as copper) laminated onto and/or between one or more sheets/layers of one or more non-conducting substrates. In various embodiments, any suitable conductors and/or non-conducting substrates known in the art can be used. In other embodiments, the superconducting qubit chip 102 can be any platform known in the art that is suitable to carry one or more superconducting qubits. Regardless of its construction, the superconducting qubit chip 102 can have on it one or more superconducting qubits, with a superconducting qubit comprising at least one Josephson junction.

As shown in FIG. 1A, the superconducting qubit chip 102 can have on it a superconducting qubit, wherein the superconducting qubit can comprise a Josephson junction 104 (marked with "X" in the drawings) and a set of one or more capacitor pads 106. The set of one or more capacitor pads 106 can comprise any capacitor pad construction known in the art. The Josephson junction 104 can be created by coupling two superconductors together via a weak link. As mentioned above, this can be accomplished by sandwiching a thin layer of non-superconducting material between two layers of superconducting material, wherein the layer of non-superconducting material is the weak link (e.g., S-N-S Josephson junction). This can also be accomplished by separating the superconductors with a thin insulating barrier, wherein the insulating barrier is the weak link (e.g., S-I-S Josephson junction). Additionally, this can be accomplished by applying a physical constriction at the point of contact between the two superconductors, wherein the constricted point is the weak link (e.g., S-s-S Josephson junction). Moreover, since the Josephson junction 104 is a macroscopic structure, it can be constructed by known integrated circuit technologies and/or techniques (e.g., photolithography, deposition, sputtering, evaporation, doping, and so on).

The Josephson junction 104 can exhibit a Cooper-pair quantum tunneling effect (e.g., electrons tunneling through the weak link in the absence of an applied voltage), thereby allowing for the flow of a supercurrent (e.g., electrical current flowing without resistance/dissipation) across the junction at sufficiently low temperatures. This quantum-mechanical behavior at the macroscopic level can allow the Josephson junction 104 to function as (or as part of) a qubit (e.g., a device that can occupy discrete/quantized energy states as well as superpositions of those energy states). In one or more embodiments, the Josephson junction 104 can be a component of a transmon qubit (e.g., a type of charge qubit), the quantized energy states of which can correspond to integer numbers of Cooper-paired electrons that have crossed the Josephson junction 104 and/or are present on a superconducting island formed in part by the Josephson junction 104. In other embodiments, the Josephson junction 104 can be a component of other types of qubits, such as a flux qubit (e.g., the quantized energy states of which can correspond to integer numbers of magnetic flux quanta penetrating a superconducting loop formed in part by the Josephson junction 104), a phase qubit (e.g., the quantized energy states of which can correspond to quantum charge oscillation amplitudes across the Josephson junction 104), and so on. In any case, properties of the Josephson junction 104 can affect the transition frequencies between these quantized energy states, and so annealing (e.g., heat treating) of the Josephson junction 104 can be implemented to tune, modify, and/or alter transition frequencies of a qubit comprising the Josephson junction 104. As mentioned above, such tuning, modification, and/or alteration can be implemented to reduce frequency collision and/or quantum crosstalk between multiple qubits, thereby improving the functionality and/or operation of multi-qubit chips.

Now, the drawings depict a transmon qubit design; that is, a superconducting qubit in which the Josephson junction 104 is coupled in parallel to a capacitor, which has a set of one or more capacitor pads 106 (also called "transmon capacitor pads 106," "capacitor pads 106," and/or "pads 106"). However, those of skill in the art will appreciate that one or more embodiments of the invention can incorporate other capacitor pad configurations (e.g. serial and/or parallel coupling) and not solely the transmon configuration. Some non-limiting examples of other qubit designs that can be used with the qubit-annealing system 100 include other types of charge qubits, phase qubits, flux qubits, fluxonium qubits, xmon qubits, quantronium qubits, and so on. In other words, even though the present disclosure explicitly discusses the details of how existing quantum circuitry of a transmon qubit (e.g., transmon capacitor pads 106) can be leveraged to perform localized annealing of the transmon qubit, those of skill in the art will appreciate that the systems and/or computer-implemented methods described herein can be implemented to leverage the existing quantum circuitry in other qubit designs to similarly facilitate annealing of those other qubits. For example, the systems and/or computer-implemented methods described herein can be implemented in conjunction with any type of quantum circuitry component, which can receive electromagnetic signals/waves as an antenna, to facilitate qubit annealing.

Moreover, even though FIGS. 1A and 1B depict a qubit having only a single Josephson junction 104 and a single set of capacitor pads 106, those of skill in the art will understand that a qubit on the superconducting qubit chip 102 can comprise any number of Josephson junctions 104 and/or any number of capacitor pads 106. Furthermore, although FIGS. 1A and 1B depict only a single superconducting qubit on the superconducting qubit chip 102, those of skill in the art will appreciate that any number of superconducting qubits can be positioned on the superconducting qubit chip 102. Similarly, those of skill in the art will understand that additional quantum circuitry (e.g., readout resonators, flux bias lines, and so on) can be incorporated onto the superconducting qubit chip 102, wherein such additional quantum circuitry is conductively, capacitively, and/or inductively coupled to the Josephson junction 104 and/or the set of one or more capacitor pads 106.

In one or more embodiments, the system 100 can include an emitter chip 108 (not depicted in FIG. 1A), also called a semiconductor chip, positioned above the superconducting qubit chip 102. A radio frequency (RF) emitter 110 can be on the emitter chip 108. The emitter chip 108 can employ a printed circuit board construction and/or any other computer chip construction known in the art such that the RF emitter 110 can be operably soldered, etched, and/or attached onto the emitter chip 108. As shown in FIG. 1B, the emitter chip 108 can be positioned above, mounted above, mounted on, and/or mounted onto the superconducting qubit chip 102, such that the RF emitter 110 is above the superconducting qubit chip 102. In one or more other embodiments, the RF emitter can be positioned directly or substantially directly vertically above the Josephson junction 104 and/or the set of one or more capacitor pads 106 (as shown in FIG. 1B). In still other embodiments, the RF emitter 110 can be positioned such that it is above the superconducting qubit chip 102 and not directly or substantially directly vertically above the Josephson junction 104 and/or the set of one or more capacitor pads 106.

As depicted in FIG. 1B, the RF emitter 110 can emit, generate, localize, and/or direct an electromagnetic signal 112 (also called wave 112 or electromagnetic wave 112) toward, on, and/or onto the set of one or more capacitor pads 106. In one or more embodiments, the set of one or more capacitor pads 106 can receive and/or capture the electromagnetic signal 112 as the electromagnetic signal 112 propagates through space/air. In such case, each pad of the set of one or more capacitor pads 106 can function as a receiving antenna (e.g., a receiving patch antenna) that responds to being exposed to the electromagnetic signal 112. As described below, the reception of the electromagnetic signal 112 by the capacitor pads 106 can cause annealing of the Josephson junction 104. Although the present disclosure explicitly describes qubit annealing by leveraging existing capacitor pads that are coupled to the qubit, those of skill in the art will appreciate that any existing circuitry that is on the superconducting qubit chip 102, that is capacitively, conductively, and/or inductively coupled to a Josephson junction, and that can receive electromagnetic radiation, waves, and/or signals propagating through space/air can be leveraged to implement one or more embodiments of the present invention.

To better understand how the set of one or more capacitor pads 106 (and/or any other circuitry on the superconducting qubit chip 102 that can receive the electromagnetic signal 112) can facilitate annealing of the Josephson junction 104, consider FIG. 2. FIG. 2 illustrates an equivalent circuit diagram of an example, non-limiting system that facilitates antenna-based qubit annealing in accordance with one or more embodiments described herein. With reference now to FIG. 2, there is illustrated an example circuit diagram 200 that shows how the capacitor pads 106 and the Josephson junction 104 respond upon receiving the electromagnetic signal 112.

First, consider a high-level explanation. As shown, even though the capacitor pads 106 make up a capacitor that is coupled in parallel to the Josephson junction 104, the separate pads of the set of one or more capacitor pads 106 (each labeled 106 in FIG. 2) can be considered as individually coupled in series (instead of collectively in parallel) with the Josephson junction 104. As mentioned above, each pad 106 can function as a receiving antenna, thereby receiving/capturing the electromagnetic signal 112. Based on receiving the electromagnetic signal 112, the capacitor pads 106 can generate an alternating current and/or voltage at or within a defined distance from the Josephson junction 104 (e.g., in the circuit lines electrically coupling the set of capacitor pads 106 to the Josephson junction 104). The generated alternating current and/or voltage can then heat the Josephson junction 104, thereby annealing the Josephson junction 104.

Now, consider a more detailed explanation. As mentioned above, the individual pads of the set of capacitor pads 106 can be thought of as being individually coupled in series to the Josephson junction 104. As also mentioned above, each pad 106 can receive/capture the electromagnetic signal 112, thereby functioning as a receiving antenna. When exposed to the electromagnetic signal 112, the electrons in each of the capacitor pads 106 can begin to oscillate according to the characteristics/properties (e.g., frequency, wavelength, amplitude, magnitude, and so on) of the electromagnetic signal 112. This oscillation of electrons in the set of capacitor pads 106 can generate/induce an alternating current 206 and/or an alternating voltage 208 in each pad 106, wherein the alternating current 206 and/or the alternating voltage 208 have substantially the same (and/or related) frequency and/or magnitude as the electromagnetic signal 112. Thus, each separate pad 106, based upon excitation by the electromagnetic signal 112, can be considered a separate oscillating signal source 202 (e.g., an alternating current and/or voltage source), wherein each oscillating signal source 202 can generate an alternating current 206 and/or an alternating voltage 208. Because FIG. 2 depicts two separate pads 106, FIG. 2 depicts two corresponding oscillating signal sources 202, each one generating an alternating current 206 and/or an alternating voltage 208. However, those of skill in the art will appreciate that additional and/or fewer capacitor pads (and therefore oscillating signal sources) can be incorporated. Overall, the effect of emitting, via the RF emitter 110, the electromagnetic signal 112 onto the set of one or more capacitor pads 106 is to cause each pad 106 to separately replicate (or substantially replicate) the electromagnetic signal 112 as an alternating current 206 and/or an alternating voltage 208 that flows through the pads 106 themselves and through the circuit lines coupling the capacitor pads 106 to the Josephson junction 104, rather than as waves/signals propagating through space/air.

In one or more embodiments, the frequency and/or magnitude of the electromagnetic wave 112 can be controlled so as to control the frequency and/or magnitude of the alternating current 206 and/or the alternating voltage 208. In some embodiments, the magnitude of the alternating voltage 208 can be limited to no more than 50 millivolts so as to avoid damaging the Josephson junction 104.

Now, each alternating current 206 and/or alternating voltage 208 is generated at a corresponding oscillating signal source 202 (e.g., at a corresponding pad 106) and can run from the corresponding oscillating signal source 202 to the Josephson junction 104 through the circuit lines electrically connecting the corresponding oscillating signal source 202 to the Josephson junction 104. In FIG. 2, "Z" represents the impedance 204 from each oscillating signal source 202 to the Josephson junction 104 (that is, impedance from each pad 106 to the junction 104). In some embodiments, the capacitor pads 106 can be symmetric, and so the two impedances 204 can be equal. In such case, the complex formulation of Ohm's law (e.g., V=I*Z) yields that the two alternating currents 206 can also be equal, and can add up at the Josephson junction 104 (since the two alternating currents 206 run in opposite directions, as shown in FIG. 2). In other embodiments, the pads 106 can be asymmetric, and so the two impedances 204 can be unequal. In such case, the complex formulation of Ohm's law yields that the two alternating currents 206 can also be unequal, and thus can partially add up at the Josephson junction 104. In either scenario, the alternating currents 206 oscillate back and forth through the circuit lines leading from the oscillating signal sources 202 (e.g., from the capacitor pads 106) to the Josephson junction 104, and such oscillation can continue for as long as the RF emitter 110 emits the electromagnetic signal 112.

As known from the complex power equation (e.g., P=V*I), the oscillation of the alternating current 206 can dissipate power in the form of heat, thereby heating the circuit lines connecting the oscillating signal sources 202 to the Josephson junction 104. The oscillating signal sources 202 (e.g., the pads 106) can, themselves, also heat up during this oscillation. This heating of the capacitor pads 106 and the lines coupling the capacitor pads 106 to the Josephson junction 104 can then heat the Josephson junction 104 (e.g., via thermal conduction). Such heating can alter the physical and/or electrical properties of the Josephson junction 104 (e.g., its critical current, its normal state resistance, and so on), thereby correspondingly altering a transition frequency of the qubit comprising the Josephson junction 104. That is, various embodiments of the present invention leverage the existing quantum circuitry on the superconducting qubit chip to anneal qubits, thereby addressing/solving the prior art problem of having to incorporate specialized tuning circuitry onto the superconducting qubit chip to tune qubit frequencies.

The Josephson junction 104 can be heated in this way to achieve a defined and/or desired level of annealing. As one of skill in the art will understand, the defined level of annealing can be based on a defined and/or desired transition frequency which the Josephson junction 104 is to achieve. For example, if the Josephson junction 104 is to have a transition frequency of A, then it must be annealed at B intensity for C amount of time. The duration, frequency, and/or magnitude of the electromagnetic signal 112 can be controlled/adjusted so as to provide the required B intensity for C amount of time. Furthermore, the level of annealing performed on the Josephson junction 104 can be monitored by monitoring the normal state electrical resistance of the Josephson junction 104 (e.g., based on the Ambegaokar-Baratoff formula relating critical current to normal state resistance). Those of skill in the art will appreciate that such monitoring can be implemented by systems and methods known in the art (e.g., via an Ohmmeter, and so on).

As explained, FIG. 2 depicts a circuit diagram 200 that illustrates the electrical response of the capacitor pads 106 and the Josephson junction 104 to the reception of the electromagnetic signal 112. As mentioned above, although the drawings depict the set of one or more capacitor pads 106 in a transmon configuration (e.g., pads of a capacitor, which is coupled in parallel to the Josephson junction 104), the systems and/or methods described herein can be adapted to be used with various other electrical components coupled to the Josephson junction 104 in lieu of the capacitor pads 106 (e.g., any component that can receive the electromagnetic signal 112 to generate an alternating current 206 and/or alternating voltage 208 can suffice). Those of skill in the art will appreciate that different but analogous circuit diagrams can be created to describe the electrical properties of such embodiments.

To better understand the physical structure/composition of the RF emitter 110, consider FIG. 3. FIG. 3 illustrates a schematic of an example, non-limiting system that facilitates antenna-based qubit annealing via a voltage-controlled oscillator in accordance with one or more embodiments described herein.

As shown, to facilitate the generation of the electromagnetic signal 112, the RF emitter 110 can comprise a voltage-controlled oscillator (VCO) 302 and an antenna 304 that is driven by the VCO 302. At a high level, the VCO 302 can generate the electromagnetic signal 112 (e.g., in the form of an alternating current/voltage running in the circuit lines from output of the VCO 302), and the antenna 304 can direct the electromagnetic signal 112 toward the set of capacitor pads 106.

More specifically, the VCO 302 can be any type of electronic oscillator (e.g., a circuit and/or device that can generate a periodic/oscillating signal, such as in the form of an alternating current/voltage) whose oscillation frequency and/or magnitude are controlled by a voltage/current input. For example, the VCO 302 can be a linear/harmonic oscillator that can generate a sinusoidal waveform/signal. In various embodiments, such a linear/harmonic oscillator can be structured as a feedback oscillator and/or a negative-resistance oscillator. A feedback oscillator, for instance, can be formed by connecting the output of an electronic amplifier (e.g., such as a transistor or operational amplifier) to a frequency-selective electronic filter (e.g., such as a network of resistors and capacitors (RC oscillator), a network of inductors and capacitors (LC oscillator), a piezoelectric crystal (like quartz), and so on). A negative-resistance oscillator, on the other hand, can be formed by applying a direct-current (DC) bias voltage to a resonant circuit (e.g., an LC circuit, a crystal, a cavity resonator, and so on) that is coupled to an element having a negative differential resistance (e.g., tunnel diode, Gunn diode, IMPATT diode, unijunction transistor, thyristors, parametric amplifier, and so on). Those of ordinary skill will appreciate that any other linear/harmonic oscillator known in the art can be incorporated (e.g., Armstrong oscillator, Clapp oscillator, Colpitts oscillator, cross-coupled oscillator, dynatron oscillator, and so on).

As another example, the VCO 302 can, in various embodiments, be a relaxation oscillator that can generate a sawtooth, square, and/or non-sinusoidal waveform/signal. Such an oscillator can be formed by creating a feedback loop comprising an energy-storing element (e.g., capacitor, inductor, and so on) and a nonlinear switching device (e.g., a flip-flop/latch, a Schmitt trigger, a negative-resistance element, and so on). Those of ordinary skill will appreciate that any other relaxation oscillator known in the art can be incorporated (e.g., multivibrator, ring oscillator, delay-line oscillator, Pearson-Anson oscillator, Royer oscillator, and so on).

Moreover, in one or more embodiments, various of the above-mentioned oscillator circuits can be outfitted with a varactor diode and/or any other reverse-biased semiconductor diode that can display voltage-dependent capacitance. Because the capacitance of a varactor diode can be voltage-dependent, changing an input voltage received by the oscillator can change the resonant frequency of the oscillator, thereby changing the frequencies of the electromagnetic waves/signals generated by the oscillator. As those of skill in the art will appreciate, an analogous result can be achieved regarding the magnitudes of the electromagnetic signals/waves generated by the oscillator. Thus, a voltage-controlled oscillator can be formed, such that the oscillator is voltage and/or frequency tunable (e.g., the voltage, magnitude, and/or frequency of the propagating electromagnetic signal can be controlled by controlling the voltage and/or frequency of the waveform generated by the voltage-controlled oscillator). Those of ordinary skill will appreciate that any other voltage-controlled oscillator known in the art can be incorporated. Because a voltage-controlled oscillator can be power-regulated (e.g., outfitted with a voltage regulator), incorporation of multiple VCOs 302 (e.g., to anneal multiple qubits simultaneously) can eliminate the need for external power-routing, thereby solving a problem of traditional laser annealers.

Once the VCO 302 generates the electromagnetic signal 112 (e.g., as an alternating current/voltage running in the circuit lines connecting the VCO 302 to the antenna 304), the antenna 304 can receive the alternating current/voltage at its input terminals, convert the received current/voltage into an electromagnetic wave/signal (e.g., signal 112), and thereby propagate the electromagnetic signal 112 through space/air and toward the capacitor pads 106.

In various embodiments, the antenna 304 can be a microstrip antenna (e.g., a patch antenna) that can be etched, soldered, and/or otherwise attached onto the emitter chip 108. In one or more other embodiments, the antenna 304 can be a dipole antenna, a monopole antenna, an array antenna, a loop antenna, an aperture antenna, a horn antenna, a parabolic antenna, a plasma antenna, and so on. In still other embodiments, the antenna 304 can be any device known in the art and that can propagate an electromagnetic signal through space/air (and/or otherwise across a medium lacking electrical conductors).

In one or more embodiments, the antenna 304 can emit the electromagnetic signal 112 such that the electromagnetic signal 112 is substantially isotropic (e.g., the electromagnetic signal 112 is radiated with substantially equal strength in every direction, thereby having a substantially spherical radiation pattern). In one or more other embodiments, the antenna 304 can emit and/or localize/direct the electromagnetic signal 112 such that the electromagnetic signal 112 is omnidirectional (e.g., the electromagnetic signal 112 is radiated substantially symmetrically with respect to a given axis, thereby having a substantially torus-like radiation pattern). In still one or more other embodiments, the antenna 304 can emit and/or localize/direct the electromagnetic signal 112 such that the electromagnetic signal 112 is directional (e.g., the electromagnetic signal 112 is radiated more strongly in a given direction than in other directions, thereby having a radiation pattern with at least one main lobe). In any case, the electromagnetic signal 112 can be emitted by the antenna 304 toward, onto, and/or on the set of one or more capacitor pads 106.

In various embodiments, the antenna 304 can be sized to match the set of one or more capacitor pads 106 of the Josephson junction 104. Because each pad 106 of the Josephson junction 104 can act as a receiving patch antenna, it can be considered a resonant device/receiver that operates efficiently over a narrow frequency band. In some embodiments, that frequency band can include electromagnetic signals/waves having wavelengths that are approximately four times the length of each pad 106 (e.g., by the nature of patch antennas). Thus, the antenna 304 can be sized appropriately so as to efficiently localize/direct signals in that frequency band (e.g., half and/or quarter wavelength signals) onto the pads 106. Those of ordinary skill in the art will appreciate that known methods for sizing antennas can be incorporated.

In one or more embodiments, the VCO 302 can be controlled by a microcontroller 306 that can be on the emitter chip 108. The microcontroller 306 can comprise at least one computer processing unit (e.g., processor), a computer-readable storage/memory, programmable input/output peripherals (e.g., switches, buttons, relays, solenoids, light-emitting diodes, liquid-crystal displays, sensors, and so on), and so on. Those of skill will understand that any programmable microcontroller known in the art can be incorporated.

In various embodiments, the microcontroller 306 can signal (e.g., via the signal line 308) the VCO 302 to generate the electromagnetic signal 112. For example, the microcontroller 306 can send a power-on signal via the signal line 308, thereby causing the VCO 302 to power-on and begin generating the electromagnetic signal 112. As another example, the microcontroller 306 can send a power-off signal via the signal line 308, thereby causing the VCO 302 to power-off and cease generating the electromagnetic signal 112. Thus, a duration of the electromagnetic signal 112 can be controlled. In various embodiments, the power-on/power-off signals can be single bit signals (e.g., 0 represents power-off, 1 represents power-on), and/or any other signals known in the art.

Figure 4:
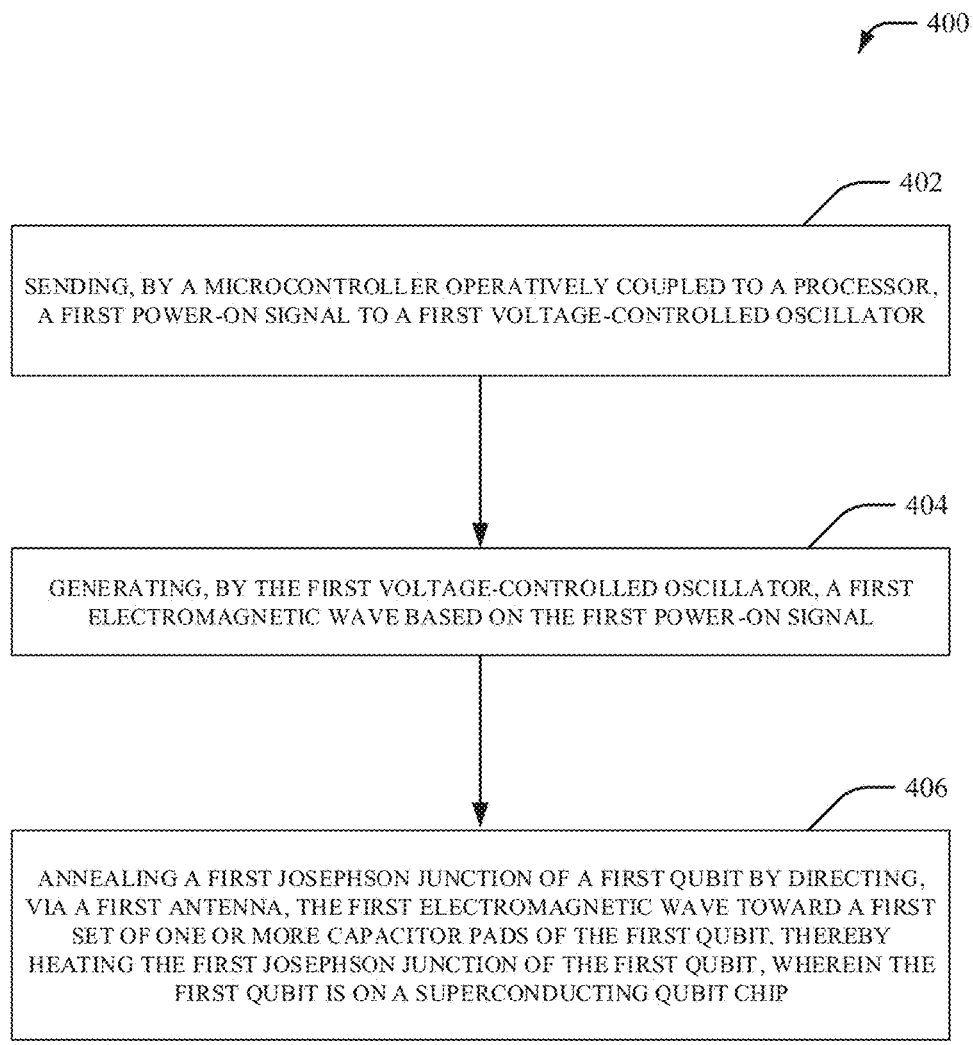
FIG. 4 illustrates a flow diagram of an example, non-limiting computer-implemented method that facilitates using a voltage-controlled oscillator to perform antenna-based qubit annealing in accordance with one or more embodiments described herein.

Now, consider FIG. 4. FIG. 4 illustrates a flow diagram of an example, non-limiting computer-implemented method that facilitates using a voltage-controlled oscillator to perform antenna-based qubit annealing in accordance with one or more embodiments described herein. That is, FIG. 4 depicts a computer-implemented method 400 that can be implemented, for example, by the system 300 of FIG. 3.

At step 402, a microcontroller operatively coupled to a processor can send a first power-on signal to a first VCO. At step 404, based on the first power-on signal, the first VCO can generate a first electromagnetic wave (e.g., an alternating current/voltage running through the output lines of the first VCO, substantially as described above). At step 406, a first Josephson junction of a first qubit can be annealed. To facilitate this annealing, a first antenna can direct the first electromagnetic wave toward a first set of one or more capacitor pads of the first qubit, substantially as described above. This can heat the first Josephson junction of the first qubit, which can be on a superconducting qubit chip.

Figure 5:
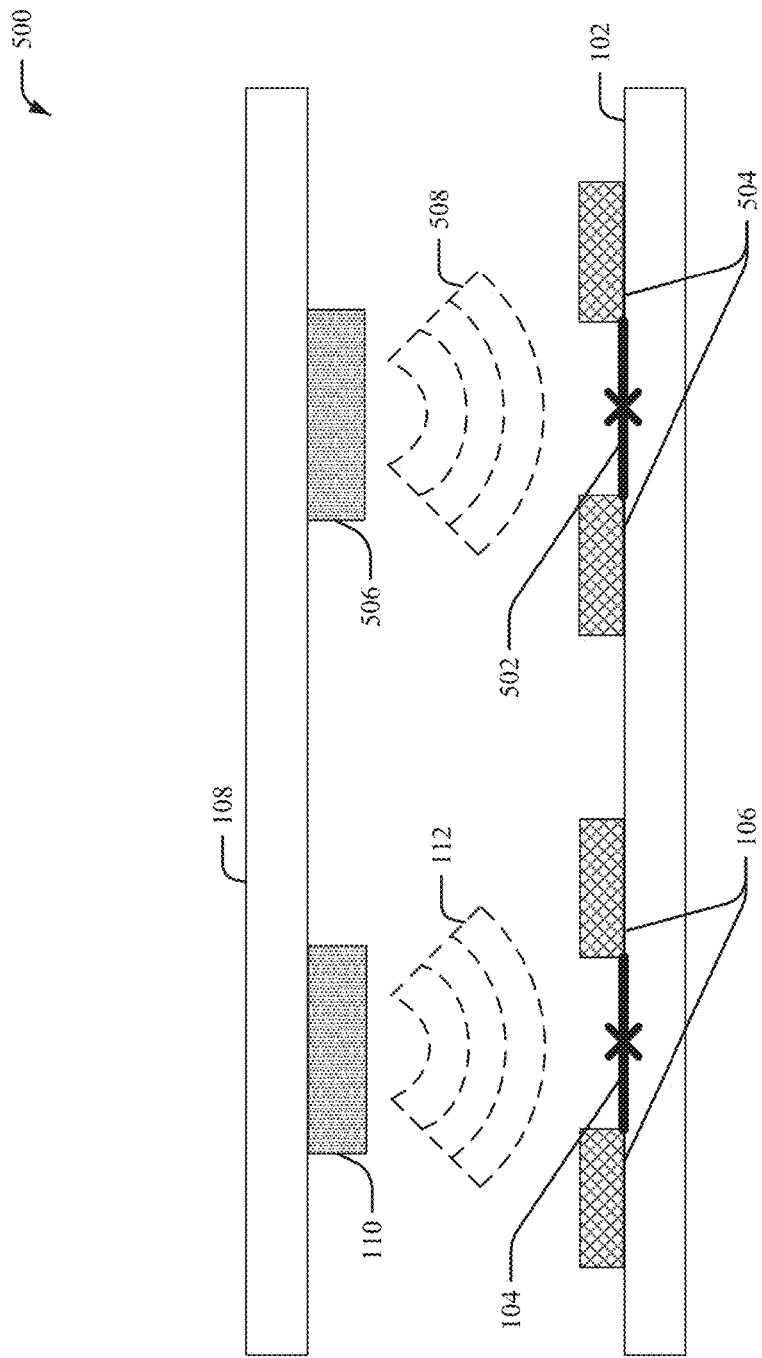
FIG. 5 illustrates a side-view schematic of an example, non-limiting system that facilitates antenna-based qubit annealing of multiple qubits in accordance with one or more embodiments described herein.

Now, consider FIG. 5. FIG. 5 illustrates a side-view schematic of an example, non-limiting system that facilitates antenna-based qubit annealing of multiple qubits in accordance with one or more embodiments described herein. As shown, the qubit annealing system 500 can comprise the superconducting qubit chip 102, the Josephson junction 104, the set of one or more capacitor pads 106, the emitter chip 108, and the RF emitter 110 which can emit/generate and/or localize/direct the electromagnetic signal 112.

As shown, the system 500 can further comprise a second Josephson junction 502 of a second qubit on the superconducting qubit chip 102 and having a second set of one or more capacitor pads 504, and a second RF emitter 506 on the emitter chip 108 and that can emit/generate and localize/direct a second electromagnetic signal/wave 508 toward/on/onto the second set of one or more capacitor pads 504, thereby annealing the second Josephson junction 502. Additionally, the second RF emitter 506 can emit/generate and localize/direct the second electromagnetic signal 508 independently of and concurrently or sequentially with the RF emitter 110 emitting and localizing the electromagnetic signal 112, thereby respectively facilitating independent and concurrent or sequential localized annealing of the Josephson junction 104 and the second Josephson junction 502. Because the electromagnetic signal 112 and the second electromagnetic signal 508 can each be independently localized/directed by their respective RF emitters, they can propagate through space/air and/or be received by their respective target qubits/capacitor pads without substantially interfering with each other. In other words, the electromagnetic signal 112 can propagate so as to not anneal the second Josephson junction 502, and the second electromagnetic signal 508 can propagate so as to not anneal the Josephson junction 104. Moreover, not only can the Josephson junction 104 and the second Josephson junction 502 be independently annealed via localized emission of the electromagnetic signals 112 and 508 (such that the two junctions 104 and 502 can achieve distinct and/or different levels of annealing, and such that the annealing of one junction does not affect the annealing of the other), but they can also be annealed simultaneously/concurrently, thereby saving time and constituting a significant advantage over serial annealing.

Additionally, as shown in FIG. 5, the RF emitter 110 can be positioned above the set of one or more capacitor pads 106 of the Josephson junction 104 and the second RF emitter 506 can be positioned above the second set of one or more capacitor pads 504 of the second Josephson junction 502. This can help to localize/direct the electromagnetic signals 112 and 508 such that they are received only by their respectively targeted Josephson junctions (e.g., signal 112 received by pads 106 of junction 104 and not by pads 504 of junction 502; signal 508 received by pads 504 of junction 502 and not by pads 106 of junction 104).

Figure 6:
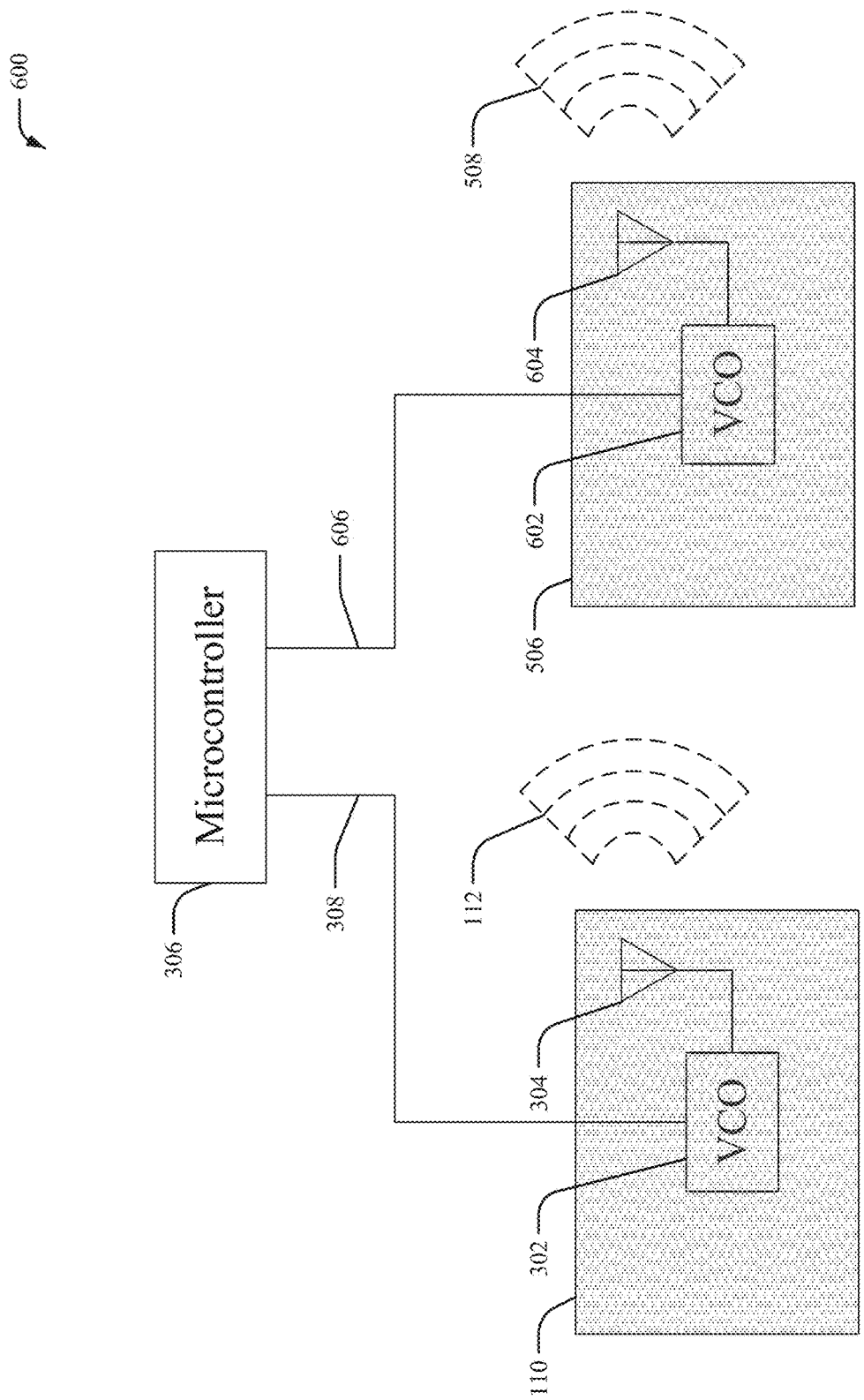
FIG. 6 illustrates a schematic of an example, non-limiting system that facilitates antenna-based qubit annealing of multiple qubits via multiple voltage-controlled oscillators in accordance with one or more embodiments described herein.

Now, consider FIG. 6. FIG. 6 illustrates a schematic of an example, non-limiting system that facilitates antenna-based qubit annealing of multiple qubits via multiple voltage-controlled oscillators in accordance with one or more embodiments described herein. That is, FIG. 6 depicts the high-level structure/composition of the RF emitters 110 and 506 in FIG. 5.

As shown, the system 600 can comprise the VCO 302, the antenna 304, and the microcontroller 306. Additionally, the second RF emitter 506 can comprise a second VCO 602 and a second antenna 604. Just as the microcontroller 306 can control the VCO 302 by sending power-on/power-off signals via the signal line 308, the microcontroller 306 can likewise control the VCO 602 by sending power-on/power-off signals via the signal line 606, substantially as described above. In various embodiments, the microcontroller 306 can signal the second RF emitter 506 to generate (e.g., via the second VCO 602) and direct (e.g., via the second antenna 604) the second electromagnetic signal 508 toward/on/onto the second set of one or more capacitor pads 504 of the second Josephson junction 502 on the superconducting qubit chip 102, thereby annealing the second Josephson junction 502. In various embodiments, both the VCO 302 and the second VCO 602 are individually voltage and frequency tunable, substantially as described above.

As described above, such various embodiments can facilitate independent and concurrent (or sequential) localized annealing of multiple qubits on a multi-qubit chip, thereby constituting a significant advantage over conventional serial annealing. Additionally, because the VCO 302 and the second VCO 602 can each be power-regulated (e.g., each outfitted with a voltage regulator, as described below), power usage/dissipation (e.g., when signals are generated) by one VCO can avoid affecting the power usage/dissipation by the other. Thus, external power routing of the entire system 600 is not necessary, thereby solving a problem of traditional photonic laser annealers.

Figure 7:
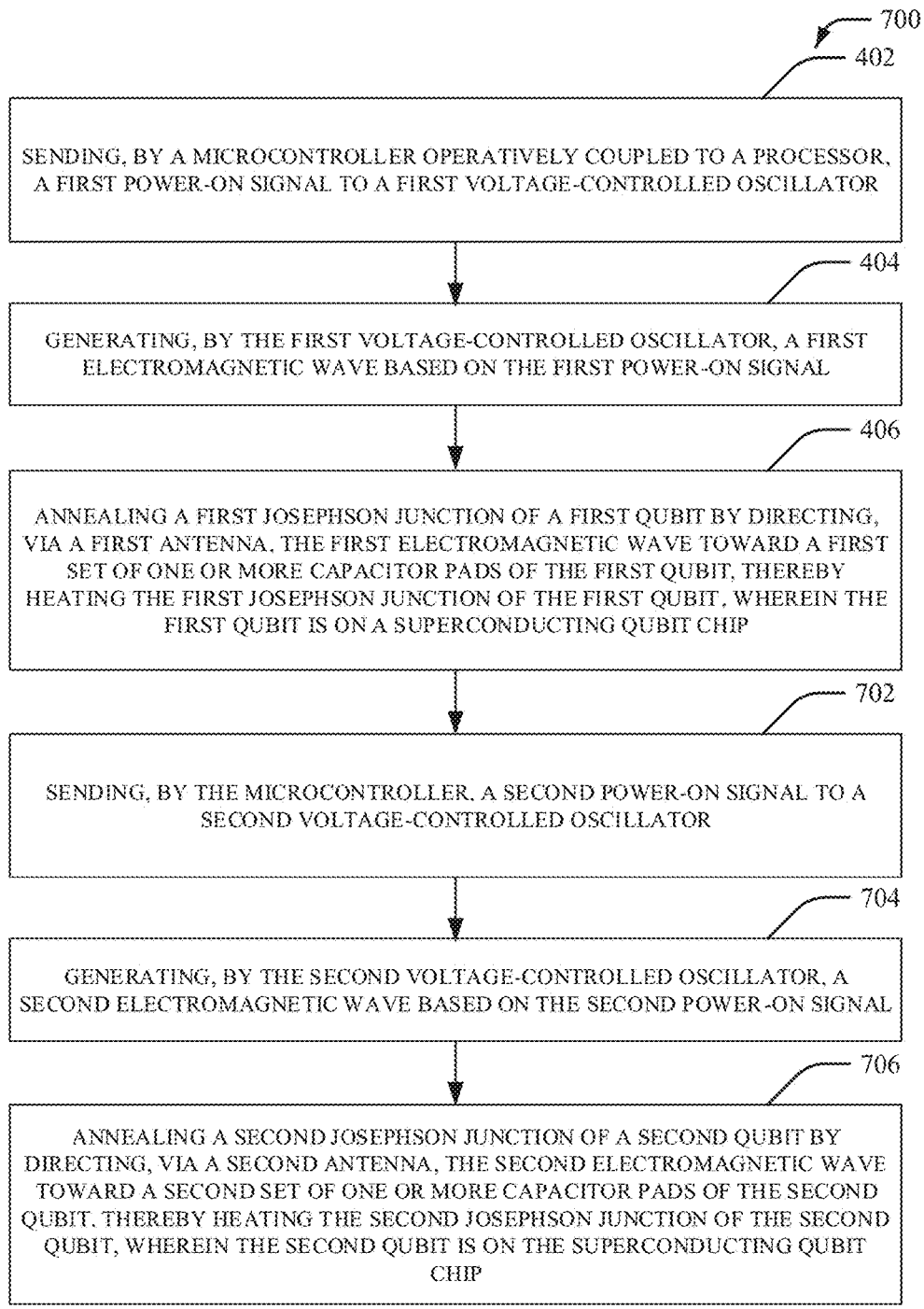
FIG. 7 illustrates a flow diagram of an example, non-limiting computer-implemented method that facilitates using at least two voltage-controlled oscillators to perform antenna-based qubit annealing of at least two qubits in accordance with one or more embodiments described herein.

Now, consider FIG. 7. FIG. 7 illustrates a flow diagram of an example, non-limiting computer-implemented method that facilitates using at least two voltage-controlled oscillators to perform antenna-based qubit annealing of at least two qubits in accordance with one or more embodiments described herein. That is, FIG. 7 depicts a computer-implemented method that can comprise the computer-implemented method 400 and can further include annealing a second Josephson junction by a second VCO.

The first three steps can be as described above. At step 402, a microcontroller operatively coupled to a processor can send a first power-on signal to a first VCO. At 404, the first VCO can generate a first electromagnetic wave based on the first power-on signal. At 406, a first Josephson junction of a first qubit can be annealed. This can be facilitated by a first antenna that can direct the first electromagnetic wave toward a first set of one or more capacitor pads of the first qubit. This can heat the first Josephson junction of the first qubit, which can be located on a superconducting qubit chip.

Now, at 702, the microcontroller can send a second power-on signal to a second VCO. At 704, the second VCO can generate a second electromagnetic wave based on the second power-on signal. At 706, a second Josephson junction of a second qubit can be annealed. This can be facilitated by a second antenna that can direct the second electromagnetic wave toward a second set of one or more capacitor pads of the second qubit. This can heat the second Josephson junction of the second qubit, which can be located on the superconducting qubit chip. Again, an advantage of these one or more embodiments is to eliminate the need to route external power supplies (e.g., since each VCO can be individually power-regulated).

Moreover, the first VCO and the second VCO can, in various embodiments, be individually voltage and frequency tunable, substantially as described above.

In one or more embodiments, the qubit annealing systems 500 and 600, and the computer-implemented method 700, can be generalized to describe parallel/concurrent annealing of multiple qubits on a multi-qubit chip. For example, the generalized system can comprise a superconducting qubit chip (e.g., 102) having one or more qubits with one or more Josephson junctions (e.g., 104 and 502) and one or more sets of one or more capacitor pads (e.g., 106 and 504). Moreover, the generalized system can comprise a microcontroller (e.g., 306) to control annealing of the one or more Josephson junctions of the one or more qubits. The generalized system can also include one or more voltage-controlled oscillators (VCOs) (e.g., 302 and 602) that receive power-on or power-off signals (e.g., via the signals lines 308 and 606) from the microcontroller. Furthermore, the generalized system can comprise one or more antennas (e.g., 304 and 604). In various embodiments, the microcontroller can signal the one or more VCOs to cause the one or more VCOs to generate electromagnetic waves (e.g., 112 and 508), which can be directed by the one or more antennas toward the one or more sets of one or more capacitor pads of the one or more qubits, thereby annealing the one or more Josephson junctions of the one or more qubits substantially as described above. Again, an advantage of these embodiments is to facilitate antenna-based annealing of multiple qubits on a multi-qubit chip and to eliminate the need for power-routing, since the one or more VCOs can be individually power-regulated (as described below), in contrast to the conventional photonic laser annealer known in the art.

In one or more embodiments, the one or more VCOs (e.g., 302 and 602) can operate independently and concurrently (or sequentially), thereby facilitating independent and concurrent or sequential localized annealing of the one or more Josephson junctions of the one or more qubits (e.g., 104 and 502). An advantage of these embodiments is to save time over conventional serial annealing. In various other embodiments, the one or more VCOs (e.g., 302 and 602) can be independently voltage and frequency tunable, substantially as described above.

Figure 8:
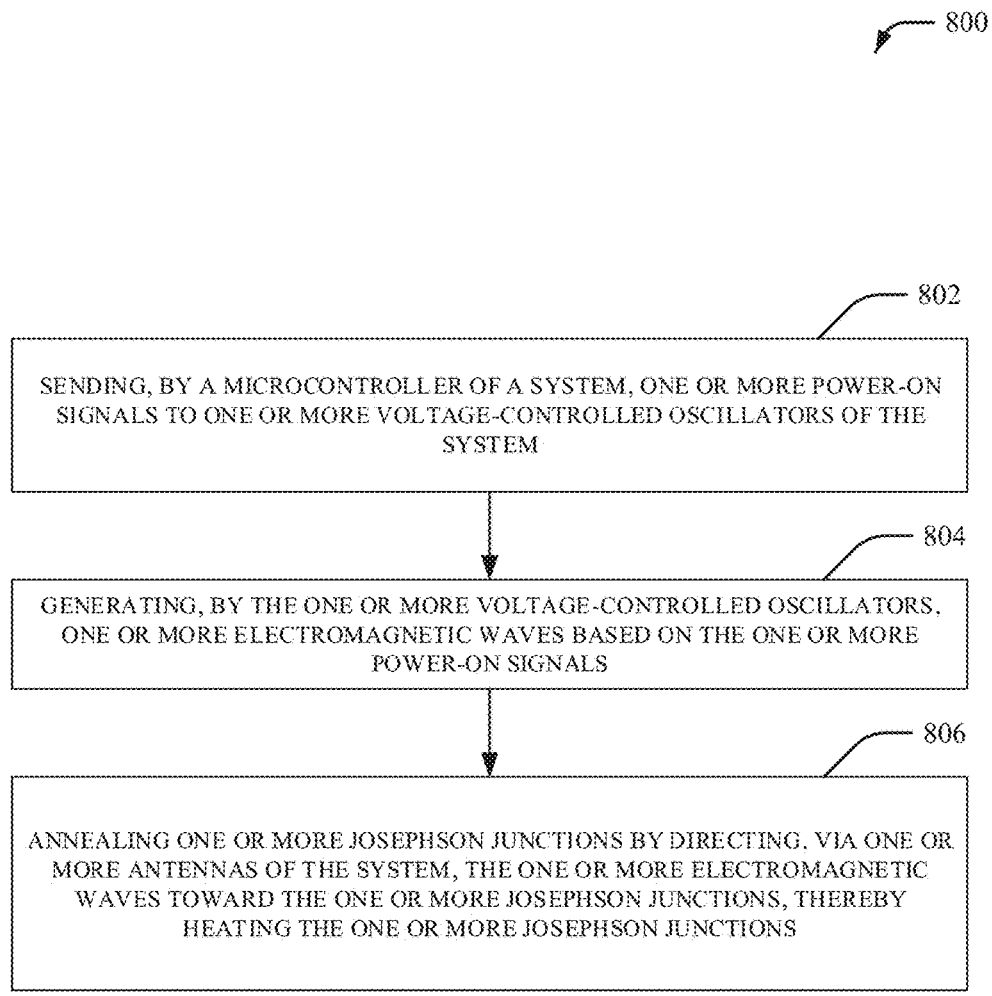
FIG. 8 illustrates a flow diagram of an example, non-limiting computer-implemented method that facilitates using multiple voltage-controlled oscillators to perform antenna-based qubit annealing of multiple qubits in accordance with one or more embodiments described herein.

Now, consider FIG. 8. FIG. 8 illustrates a flow diagram of an example, non-limiting computer-implemented method that facilitates using multiple voltage-controlled oscillators to perform antenna-based qubit annealing of multiple qubits in accordance with one or more embodiments described herein. That is, FIG. 8 depicts a computer-implemented method 800 that is a generalized form of the computer-implemented method 700.

At step 802, a microcontroller of a system can send one or more power-on signals to one or more VCOs of the system. At step 804, the one or more VCOs can generate one or more electromagnetic waves based on the one or more power-on signals. At step 806, one or more Josephson junctions can be annealed. This can be facilitated by one or more antennas that can direct the one or more electromagnetic waves toward the one or more Josephson junctions, thereby heating the one or more Josephson junctions. Again, an advantage of these embodiments is to facilitate independent and concurrent (or sequential) localized annealing of multiple qubits on a multi-qubit chip without having to perform external power routing (e.g., since the one or more VCOs can be individually power-regulated).

Figure 9:
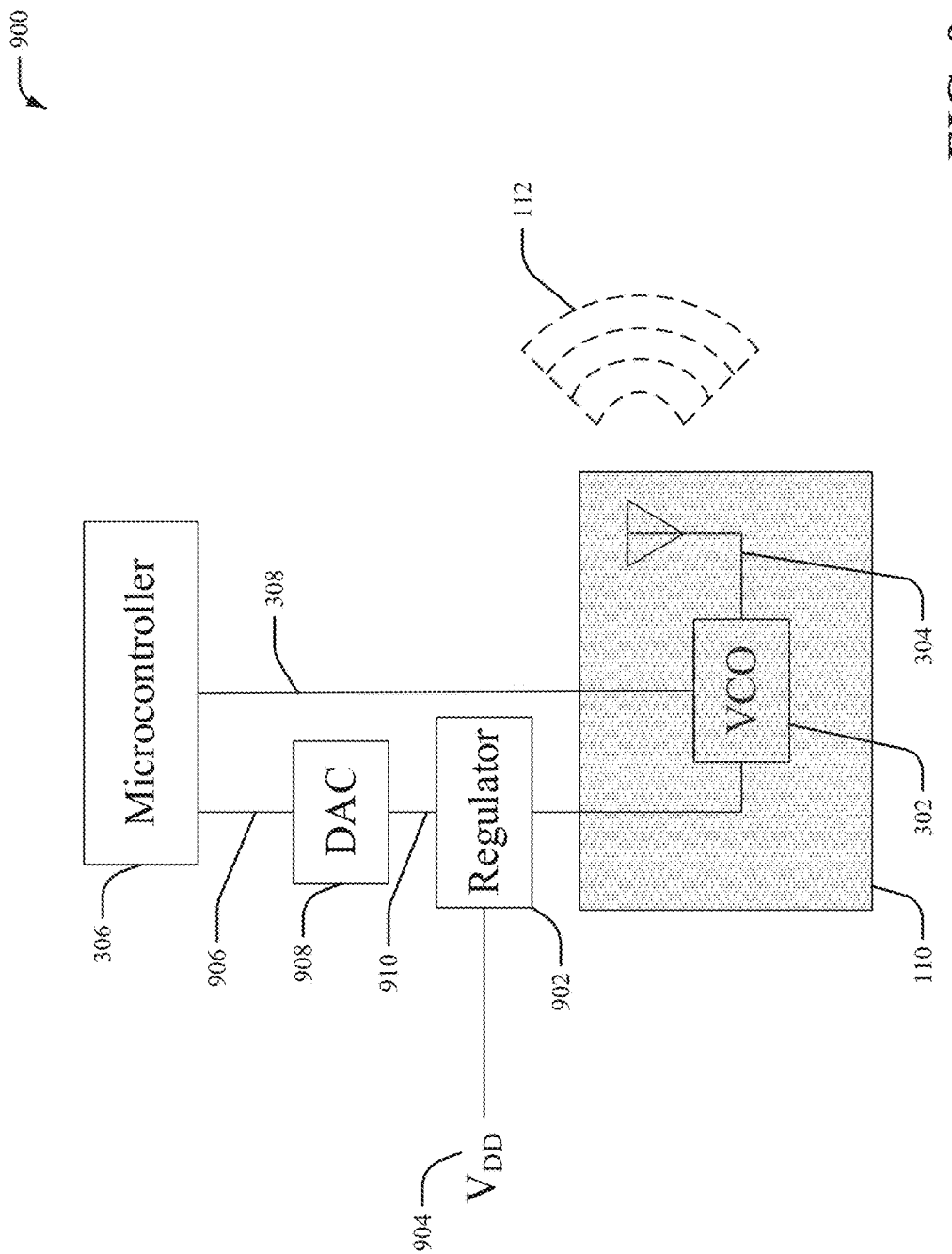
FIG. 9 illustrates a schematic of an example, non-limiting system that facilitates antenna-based qubit annealing using a digital-to-analog converter and a voltage regulator in accordance with one or more embodiments described herein.

As mentioned, the VCOs discussed in the various embodiments thus far can be voltage and/or frequency tunable and can be individually power-regulated. Thus, such VCOs can control a magnitude and/or frequency of the electromagnetic signals that they generate and do not require external power routing. To better understand how such voltage and/or frequency tunability and elimination of power routing can be facilitated, consider FIG. 9. FIG. 9 illustrates a schematic of an example, non-limiting system that facilitates antenna-based qubit annealing using a digital-to-analog converter and a voltage regulator in accordance with one or more embodiments described herein. As shown, the system 900 can comprise the VCO 302, the antenna 304, and the microcontroller 306.

Additionally, the system 900 can further comprise a voltage regulator 902 that can receive a supply voltage 904, and a digital-to-analog converter (DAC) 908. At a high level, the DAC 908 can receive and convert a digital signal (e.g., a control signal) from the microcontroller (e.g., via the signal line 906) to yield an analog signal (e.g., outputted to the signal line 910). The voltage regulator 902 can then feed the analog signal (and/or a different voltage based on the analog signal, such as a percentage of the supply voltage 904 that is represented by the analog signal) to the VCO 302. In one or more embodiments, the analog signal can control at least one of a duration, a frequency, and/or a magnitude of the electromagnetic signal 112 to achieve a defined level of the annealing of the Josephson junction 104.

More specifically, the VCO 302 can receive at least one input signal that controls at least one characteristic (e.g., magnitude/amplitude, wavelength, frequency, and so on) of the waveform generated by the VCO 302 (e.g., the electromagnetic signal 112 before it is propagated through space/air by the antenna 304). In various embodiments, the microcontroller 306 can send a control digital signal (e.g., which can be distinct from and/or related to the power-on/power-off signals described above) to the VCO 302 via the signal line 906. In some embodiments, the control digital signal can be an eight-bit digital signal (e.g., ranging from 0 to 255 in base 10). In other embodiments, the control signal can contain any number of classical bits. In still other embodiments, the control signal can be a pulse-width modulated digital signal and/or an analog signal.

Once a control signal is received by the DAC 908 from the microcontroller 306, the DAC 908 can convert the control digital signal into an analog signal. Computationally, the DAC 908 can facilitate such conversion (e.g., converting a finite-precision number to a continuous physical quantity) by constructing a piecewise constant function (e.g., composed of a sequence of rectangular/step functions) from the received digital signals. A reconstruction filter can be incorporated to smooth out the generated piecewise response into a continuous function. Those of skill in the art will appreciate that any digital-to-analog converter known in the art can be incorporated (e.g., oversampling/interpolating DACs, binary-weighted DACs, cyclic DACs, thermometer-coded DACs, hybrid DACs, and so on).

Once converted, the analog signal can be received by the voltage regulator 902. The regulator 902 can output a stable current/voltage independent of variations in the supply voltage 904, temperature, load current, and so on. The regulator 902 can, in various embodiments, be an electronic voltage regulator (e.g., a feedback voltage regulator that compares actual voltage output with a reference voltage, or a series of resistors and Zener diodes, and so on). In other embodiments, the regulator 902 can be an electromechanical voltage regulator (e.g., having a ferrous core subjected to a spring or gravitational restoring force, which core moves as a result of a magnetic field created by a too high or too low current/voltage, and which movement triggers a mechanical power switch that restores the system). As those of ordinary skill will appreciate, any voltage regulator known in the art can be incorporated.

In various embodiments, the analog signal can control at least one of a duration, a frequency, or a magnitude of the electromagnetic signal 112 to achieve a defined level of the annealing of the Josephson junction 104. For example, in some embodiments, the control digital signal can be an eight-bit digital signal. Thus, the value in base 10 of the control digital signal can represent a proportion/percentage of 255 (e.g., the largest base 10 number that can be represented by 8 classical bits), and that proportion/percentage can be preserved/coded into the analog signal by the DAC 908. Once fed to the regulator 902, that proportion/percentage of the supply voltage 904 can be outputted by the regulator 902 to be received by the VCO 302. The VCO 302 can then generate the electromagnetic signal 112 according to the proportion/percentage of the supply voltage 904 received. For example, if the base 10 value of the control digital signal is 192 out of 255, the regulator 902 can send approximately three fourths (e.g., 192/255=0.753) of the supply voltage 904 to the VCO 302, and so the electromagnetic signal 112 can be generated so as to have three fourths of a maximum generatable frequency. In other embodiments, the proportion of the supply voltage 904 received by the VCO 302 can similarly control a magnitude of the electromagnetic signal 112. In still other embodiments, multiple DACs 908 and/or regulators 902 can be incorporated so as to control multiple characteristics (e.g., both frequency and magnitude) of the electromagnetic signal 112 generated by the VCO 302. As mentioned above, an advantage of such power regulation is to facilitate antenna-based annealing of multiple qubits without having to route an external power source, unlike the traditional photonic laser annealing technique (e.g., multiple VCOs 302 can receive substantially any proportion of the supply voltage 904 without limiting and/or interfering with each other). Moreover, although the DAC 908 and the regulator 902 are illustrated as external to the RF emitter 110, those of skill will appreciate that such components can be incorporated internally to the RF emitter 110 as well.

Figure 10:
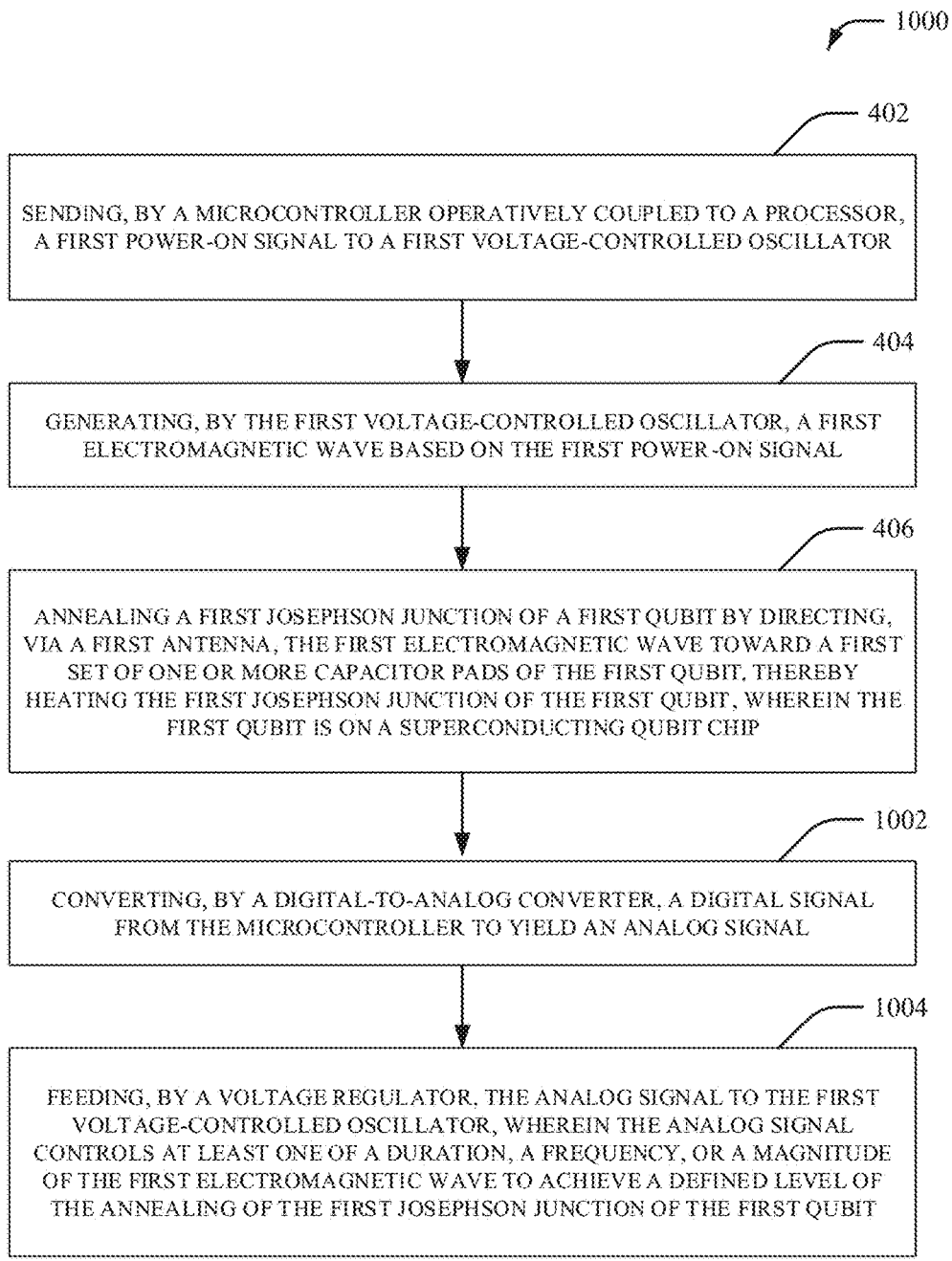
FIG. 10 illustrates a flow diagram of an example, non-limiting computer-implemented method that facilitates antenna-based qubit annealing using a digital-to-analog converter and a voltage regulator in accordance with one or more embodiments described herein.

Now, consider FIG. 10. FIG. 10 illustrates a flow diagram of an example, non-limiting computer-implemented method that facilitates antenna-based qubit annealing using a digital-to-analog converter and a voltage regulator in accordance with one or more embodiments described herein. That is, FIG. 10 depicts a computer-implemented method 1000 that can comprise the computer-implemented method 400 and can further include annealing qubits using a digital-to-analog converter.

As shown, the first three steps can be as explained above. At 402, a microcontroller operatively coupled to a processor can send a first power-on signal to a first VCO. At 404, the first VCO can generate a first electromagnetic wave based on the first power-on signal. At 406, a first Josephson junction of a first qubit can be annealed. This can be facilitated by a first antenna that can direct the first electromagnetic wave toward a first set of one or more capacitor pads of the first qubit. This can heat the first Josephson junction of the first qubit, which can be on the superconducting qubit chip.

Now, at step 1002, a digital-to-analog converter can convert a digital signal from the microcontroller to yield an analog signal. At step 1004, a voltage regulator can feed the analog signal (or a voltage based on the analog signal) to the first VCO. Additionally, the analog signal can control at least one of a duration, a frequency, or a magnitude of the first electromagnetic wave to achieve a defined level of the annealing of the first Josephson junction of the first qubit, substantially as described above.

Figure 11:
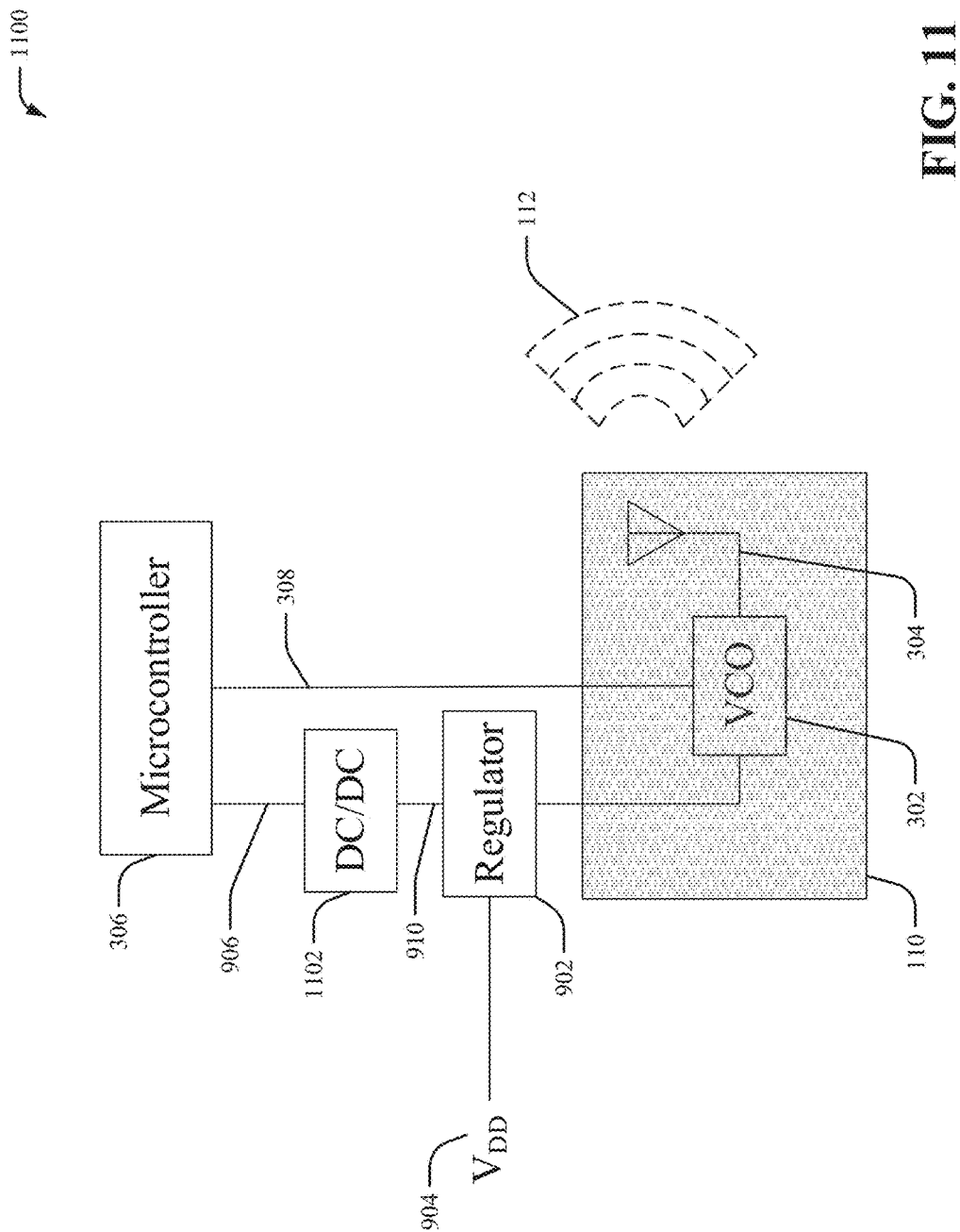
FIG. 11 illustrates a schematic of an example, non-limiting system that facilitates antenna-based qubit annealing using a direct-current-to-direct-current converter and a voltage regulator in accordance with one or more embodiments described herein.

Now, consider FIG. 11. FIG. 11 illustrates a schematic of an example, non-limiting system that facilitates antenna-based qubit annealing using a direct-current-to-direct-current (DC-DC) converter and a voltage regulator in accordance with one or more embodiments described herein. As shown, the system 1100 can comprise the VCO 302, the antenna 304, the microcontroller 306 that can produce a control digital signal into signal line 906, and the voltage regulator 902 that can receive the supply voltage 904.

Additionally, the system 1100 can comprise a direct-current-to-direct-current converter (DC/DC) 1102. The DC/DC 1102 can receive the control digital signal from the microcontroller (e.g., via the signal line 906) and convert it into a converted DC signal (e.g., outputted into signal line 910). The converted DC signal produced by the DC/DC 1102 is a digital signal (e.g., at a different voltage than the control digital signal). Thus, in various embodiments, the regulator 902 can accept analog inputs as depicted in FIG. 9, while in various embodiments it can accept digital inputs as depicted in FIG. 11. However, those of skill in the art will appreciate that much of the discussion regarding FIG. 9 can apply to FIG. 11. That is, the DC/DC 1102 can receive and convert a digital signal from the microcontroller 306 to yield a converted DC signal. Moreover, the voltage regulator 902 can feed the converted DC signal (or a voltage based on the converted DC signal) to the VCO 302. Furthermore, the converted DC signal can control at least one of a duration, a frequency, or a magnitude of the first electromagnetic wave 112 to achieve a defined level of the annealing of the Josephson junction 104, substantially as described above.

In various embodiments, the DC/DC 1102 can be an electronic converter (e.g., switching converters storing energy in inductors/transformers, switching converters storing energy in capacitors, hard switched converters, resonant converters, continuous/discontinuous converters, and so on) and/or an electromechanical converter (e.g., dynamotor, and so on). Those of ordinary skill in the art will appreciate that any digital-to-digital converter known in the art can be incorporated.

Figure 12:
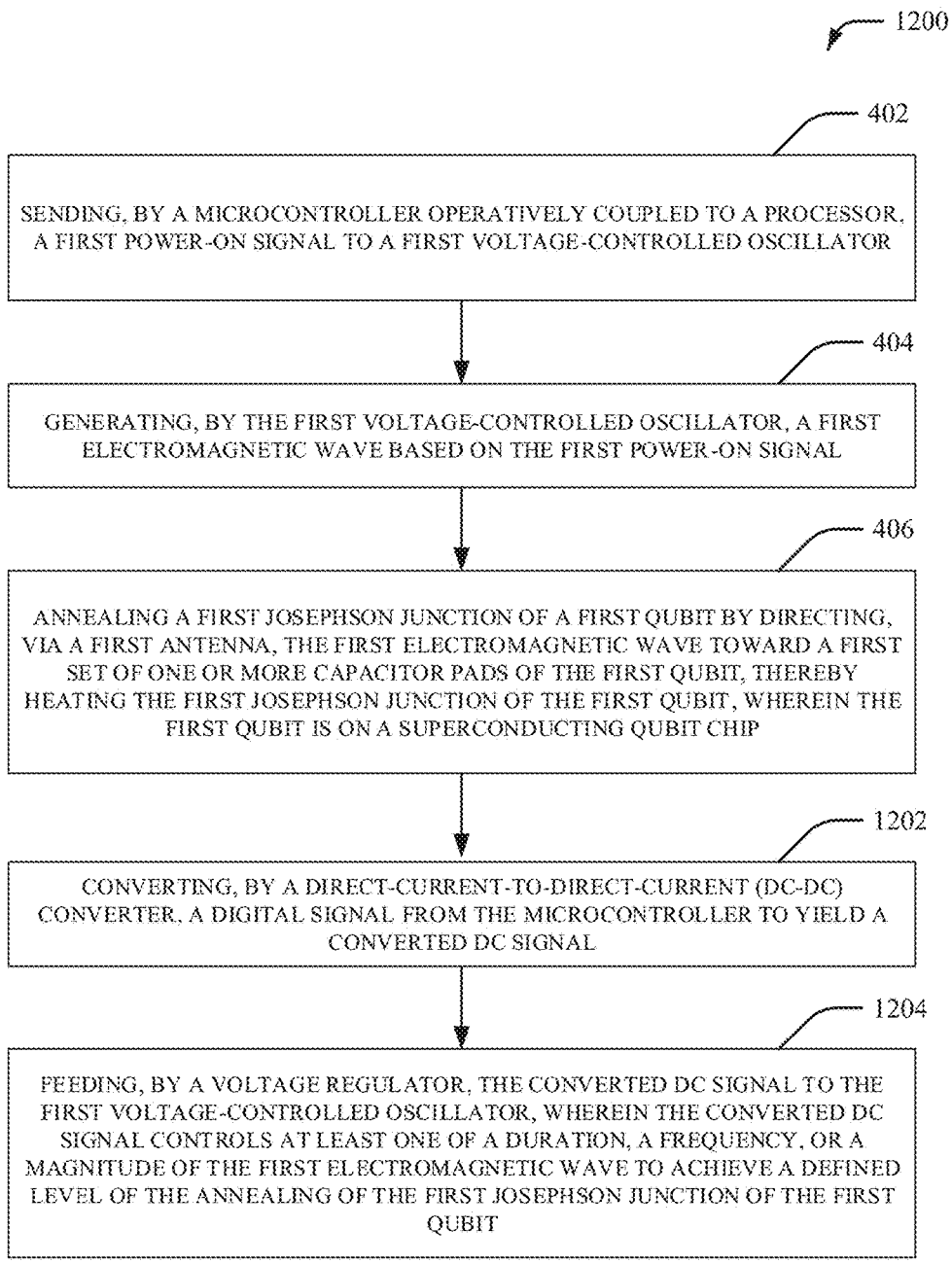
FIG. 12 illustrates a flow diagram of an example, non-limiting computer-implemented method that facilitates antenna-based qubit annealing using a direct-current-to-direct-current converter and a voltage regulator in accordance with one or more embodiments described herein.

Now, consider FIG. 12. FIG. 12 illustrates a flow diagram of an example, non-limiting computer-implemented method that facilitates antenna-based qubit annealing using a digital-to-digital converter and a voltage regulator in accordance with one or more embodiments described herein. The first three steps can be as described above. At 402, a microcontroller operatively coupled to a processor can send a first power-on signal to a first VCO. At 404, the first VCO can generate a first electromagnetic wave based on the first power-on signal. At 406, a first Josephson junction of a first qubit can be annealed. This can be facilitated by a first antenna that can direct the first electromagnetic wave toward a first set of one or more capacitor pads of the first qubit. This can heat the first Josephson junction of the first qubit, which can be on the superconducting qubit chip.

Now, at 1202, a direct-current-to-direct-current (DC-DC) converter can convert a digital signal from the microcontroller to yield a converted DC signal. At 1204, a voltage regulator can feed the converted DC signal to the first VCO. Moreover, the converted DC signal can control at least one of a duration, a frequency, or a magnitude of the first electromagnetic wave to achieve a defined level of the annealing of the first Josephson junction of the first qubit, substantially as described above.

Figure 13:
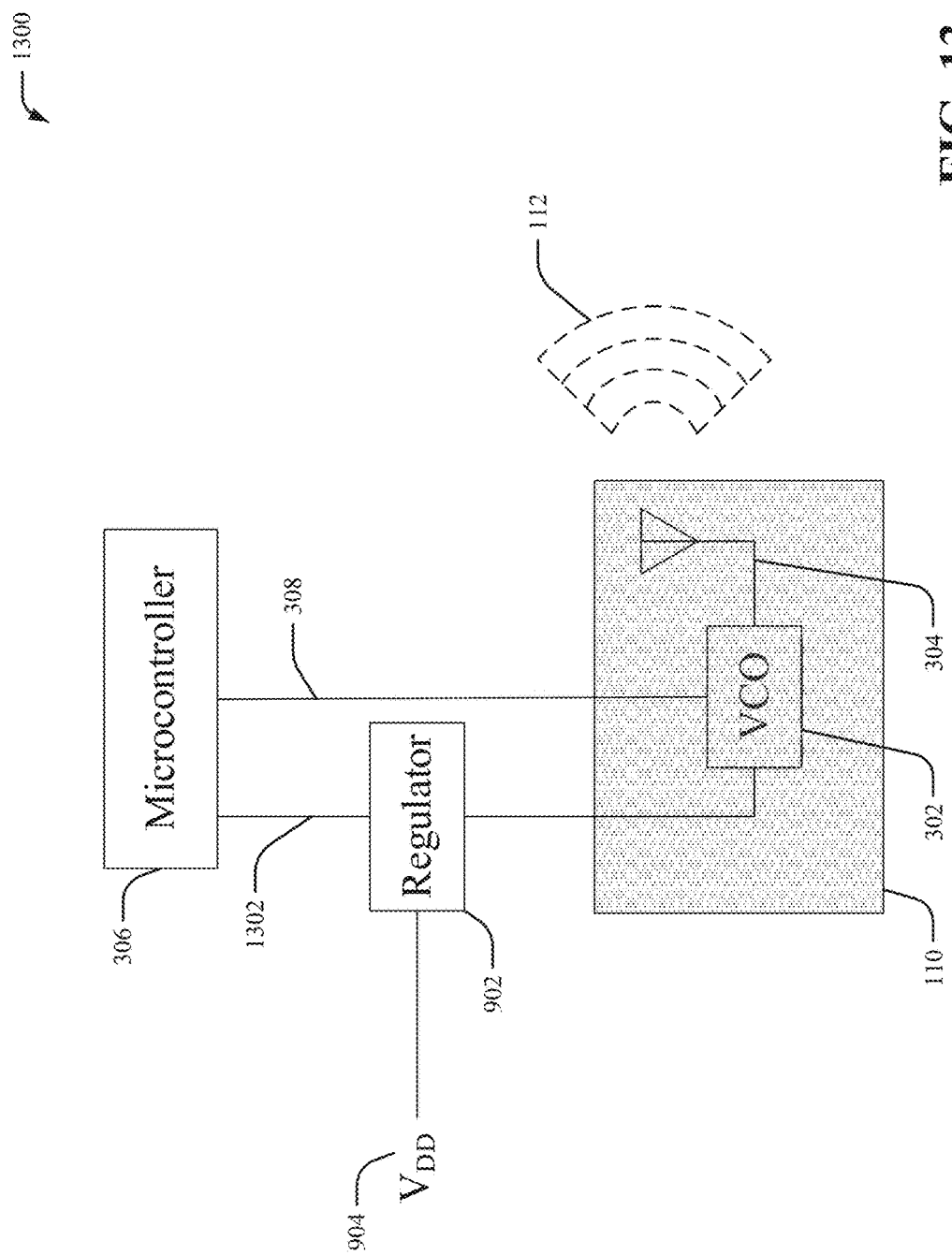
FIG. 13 illustrates a schematic of an example, non-limiting system that facilitates antenna-based qubit annealing using a pulse-width modulated signal in accordance with one or more embodiments described herein.

Now, consider FIG. 13. FIG. 13 illustrates a schematic of an example, non-limiting system that facilitates antenna-based qubit annealing using a pulse-width modulated signal in accordance with one or more embodiments described herein. As shown, the system 1300 can comprise the VCO 302, the antenna 304, the microcontroller 306, and the voltage regulator 902.

Additionally, in one or more embodiments, the microcontroller 306 can be configured to generate a pulse-width modulated signal (e.g., into signal line 1302) to control at least a duration, a frequency, or a magnitude of the electromagnetic signal 112. A pulse-width modulated signal can be a digital signal that is repeatedly and quickly powered on and off. This power switching can lower the average value of the voltage/current represented by a traditional digital signal, thereby approximating a continuous analog signal. For example, evenly alternating between a 5 volt digital signal and a 0 volt digital signal at a 1 kilo-Hertz frequency can approximate a 2.5 volt signal. By changing the percentage of time that the signal is on (e.g., at 5 volts), the average value of the voltage can be altered. So, a pulse-width modulated signal from the microcontroller 306 can be used to represent a proportion of the supply voltage 904, as described above. Again, that proportion of the supply voltage 904 can then be fed to the VCO 302 to control a characteristic (e.g., duration, frequency, magnitude, and so on) of the electromagnetic signal 112. Those of ordinary skill in the art will appreciate that much of the discussion regarding FIGS. 9 and 11 can apply to FIG. 13. Thus, the voltage regulator 902 can feed the pulse-width modulated signal from the microcontroller 306 to the VCO 302, wherein the pulse-width modulated signal can control at least one of a duration, a frequency, and/or a magnitude of the electromagnetic signal 112 to achieve a defined level of the annealing of the Josephson junction 104. An advantage of these one or more embodiments is to eliminate the need to have power converters in the qubit annealing system.

Figure 14:
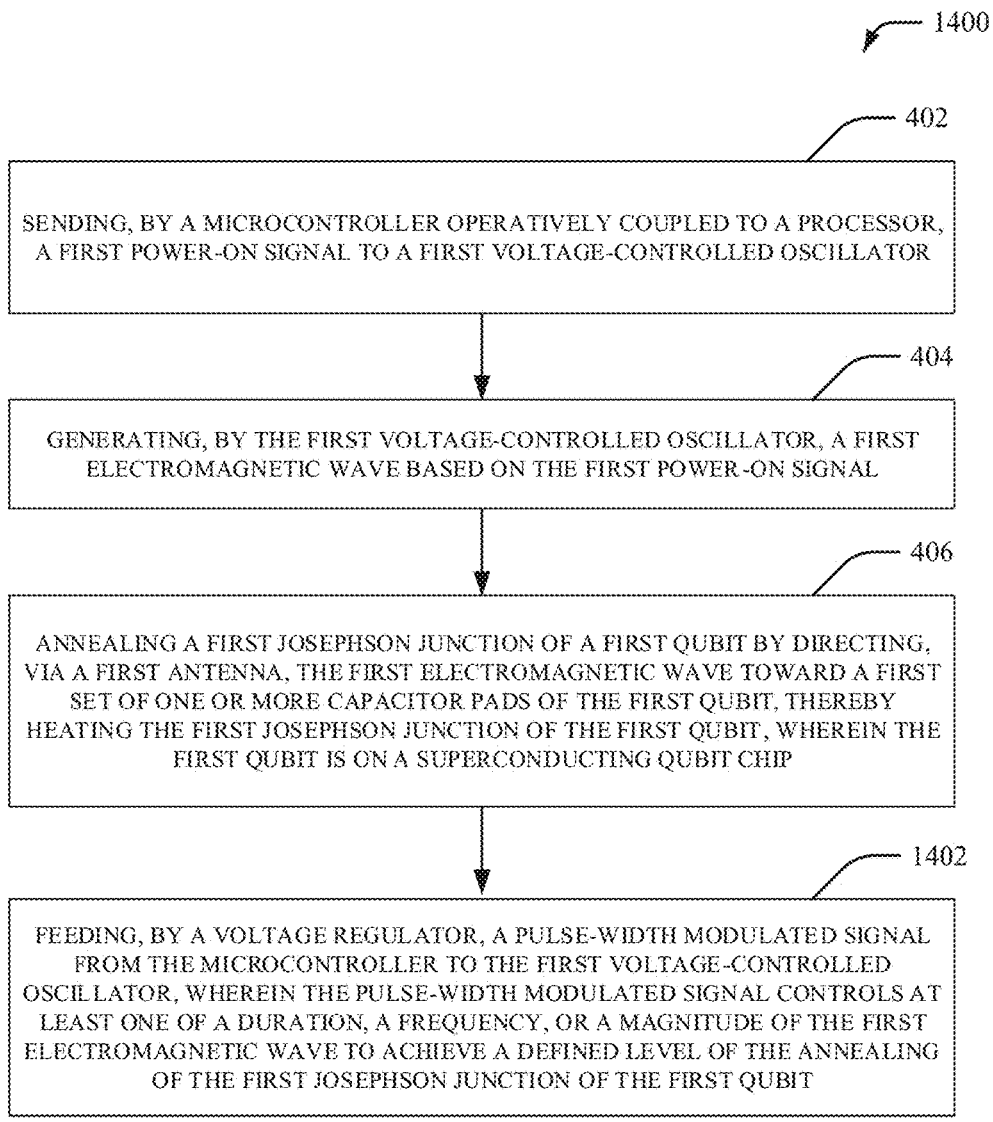
FIG. 14 illustrates a flow diagram of an example, non-limiting computer-implemented method that facilitates antenna-based qubit annealing using a pulse-width modulated signal in accordance with one or more embodiments described herein.

Now, consider FIG. 14. FIG. 14 illustrates a flow diagram of an example, non-limiting computer-implemented method that facilitates antenna-based qubit annealing using a pulse-width modulated signal in accordance with one or more embodiments described herein. The first three steps (e.g., 402, 404, and 406) can be as described several times above.

At 1402, a voltage regulator can feed a pulse-width modulated signal from the microcontroller to the first VCO. Moreover, the pulse-width modulated signal can control at least one of a duration, a frequency, or a magnitude of the first electromagnetic wave to achieve a defined level of the annealing of the first Josephson junction of the first qubit, substantially as described above.

Figure 15:
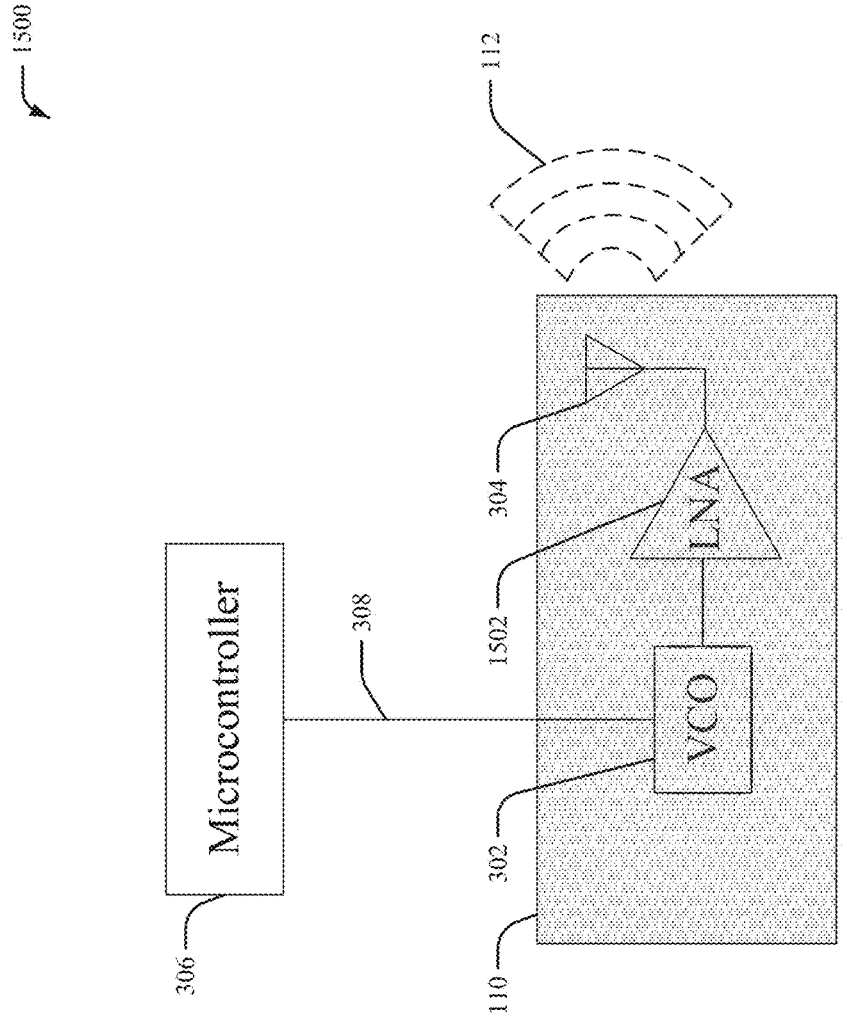
FIG. 15 illustrates a schematic of an example, non-limiting system that facilitates antenna-based qubit annealing using a low-noise amplifier in accordance with one or more embodiments described herein.
Figure 16:
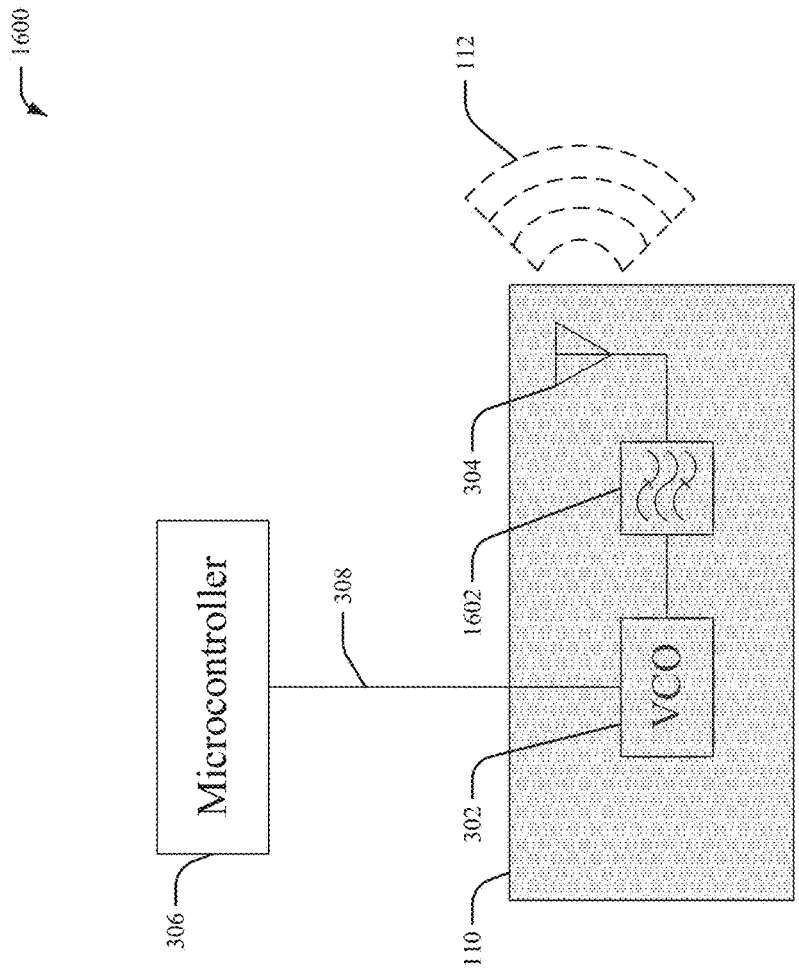
FIG. 16 illustrates a schematic of an example, non-limiting system that facilitates antenna-based qubit annealing using a radio frequency filter in accordance with one or more embodiments described herein.

Now, consider FIGS. 15 and 16. FIG. 15 illustrates a schematic of an example, non-limiting system that facilitates antenna-based qubit annealing using a low-noise amplifier in accordance with one or more embodiments described herein. Similarly, FIG. 16 illustrates a schematic of an example, non-limiting system that facilitates antenna-based qubit annealing using a radio frequency filter in accordance with one or more embodiments described herein.

In various embodiments, at least one of a low-noise amplifier 1502 or a radio frequency (RF) filter 1602 can be electrically coupled in series between the VCO 302 and the antenna 304. The low-noise amplifier (LNA) 1502 can be an electronic amplifier that amplifies the waveform generated by the VCO 302 without significantly negatively affecting its signal-to-noise ratio. Thus, the LNA 1502 can improve/augment the characteristics of the electromagnetic signal 112 (which is based on/related to the raw waveform generated by the VCO 302). The LNA 1502 can be any amplifier known in the art and/or any device that can provide gain to the waveform generated by the VCO 302 (e.g., vacuum tubes, bipolar transistors, field-effect transistors, tunnel diodes, and so on).

The filter 1602, on the other hand, can be a passive or active signal processing filter that can remove unwanted frequency components from the raw waveform generated by the VCO 302 and fed to the antenna 304. For example, the filter 1602 can, in various embodiments, be an RC filter (e.g., using resistors and capacitors), an RL filter (e.g., using resistors and inductors), an operational amplifier, a digital filter, a crystal filter, a T or pi-filter, a mechanical filter, a surface acoustic wave filter, a bulk acoustic wave filter, a garnet filter, an atomic filter, and so on.

Figure 17:
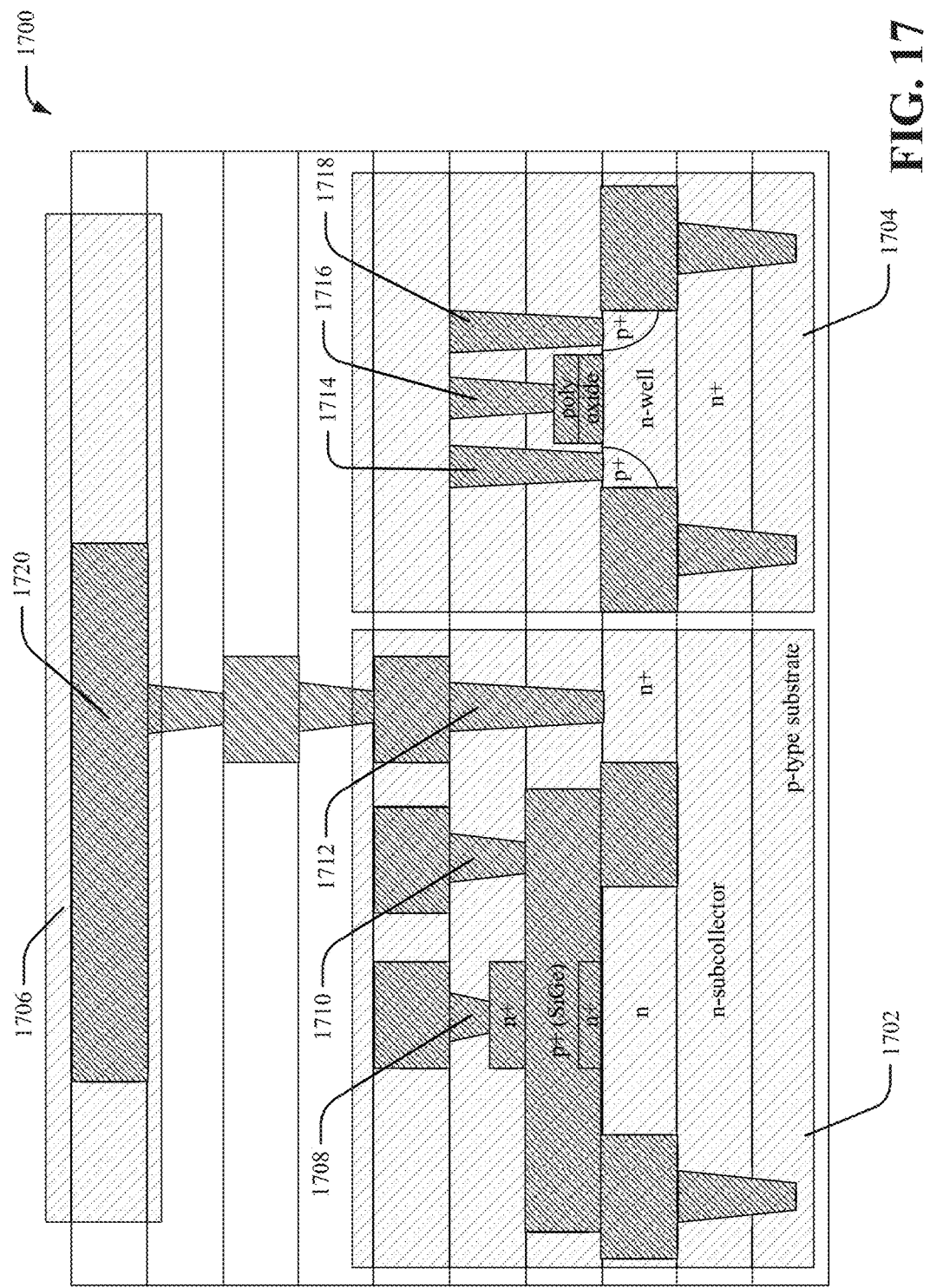
FIG. 17 illustrates a schematic of an example, non-limiting chip structure that facilitates antenna-based qubit annealing in accordance with one or more embodiments described herein.

Now, consider FIG. 17. FIG. 17 illustrates a schematic of an example, non-limiting chip structure that facilitates antenna-based qubit annealing in accordance with one or more embodiments described herein.

As shown, the system 1700 can comprise a semiconductor chip (e.g., emitter chip 108) employing a bipolar-junction and complementary metal-oxide semiconductor (BiCMOS) stack construction. The semiconductor chip can comprise layers of semiconductor and conductor materials, and so can be formed by known integrated circuit technologies and/or techniques (e.g., photolithography, deposition, sputtering, evaporation, doping, and so on). For ease of illustration, the electrically significant components of FIG. 17 (e.g., gates, drains, conductor layers, oxide layers, p-type or n-type semiconductors, and so on) are depicted with a single shading/hatching, and the filler materials (e.g., spin on dielectrics, foundational substrates, and so on) are depicted with no shading/hatching. But, those of skill will appreciate that such uniform hatching and/or non-hatching does not indicate that the various components must be made of the same material; instead, they can be made of different and/or various materials suitable for semiconductor chip fabrication, as known in the art.

The semiconductor chip can include at least three different portions: a bipolar-junction transistor (BJT) portion 1702, a complementary metal-oxide semiconductor (CMOS) portion 1704, and a top far-back-end-of-line (FBEOL) portion 1706. That is, the semiconductor chip can employ a BiCMOS stack construction. For illustrative purposes, FIG. 17 depicts a generic NPN bipolar-junction transistor in the BJT portion 1702 (e.g., having emitter 1708, base 1710, and collector 1712). Also, for illustrative purposes, FIG. 17 depicts a generic p-type CMOS transistor in the CMOS portion 1704 (e.g., having source 1714, gate 1716, and drain 1718). Lastly, an antenna 1720 (e.g., a patch antenna) is shown in the top FBEOL portion 1706, where any other FBEOL interconnects can be soldered/attached onto the semiconductor chip.

Traditional CMOS technology is generally well-suited for digital logic circuitry. For example, it requires a low drive current, has a low static power dissipation, boasts higher noise margins, and allows for higher packing density (e.g., lower cost per CMOS device). Traditional BJT technology, on the other hand, is generally well-suited for high-voltage and/or high frequency applications. For example, it has a high switching speed, allows for high current drive per unit area (e.g., allowing for high gain), and handles analog signals effectively. By combining both of these chip structures onto a single board, a better chip structure than either technology independently can be obtained.

With these advantages in mind, in one or more embodiments, the VCO 302 can be fabricated in the BJT portion 1702 of the semiconductor chip, the microcontroller 306 can be fabricated in the CMOS portion 1704 of the semiconductor chip, and the antenna 304 can be fabricated in the top FBEOL portion 1706 of the semiconductor chip.

Figure 18:
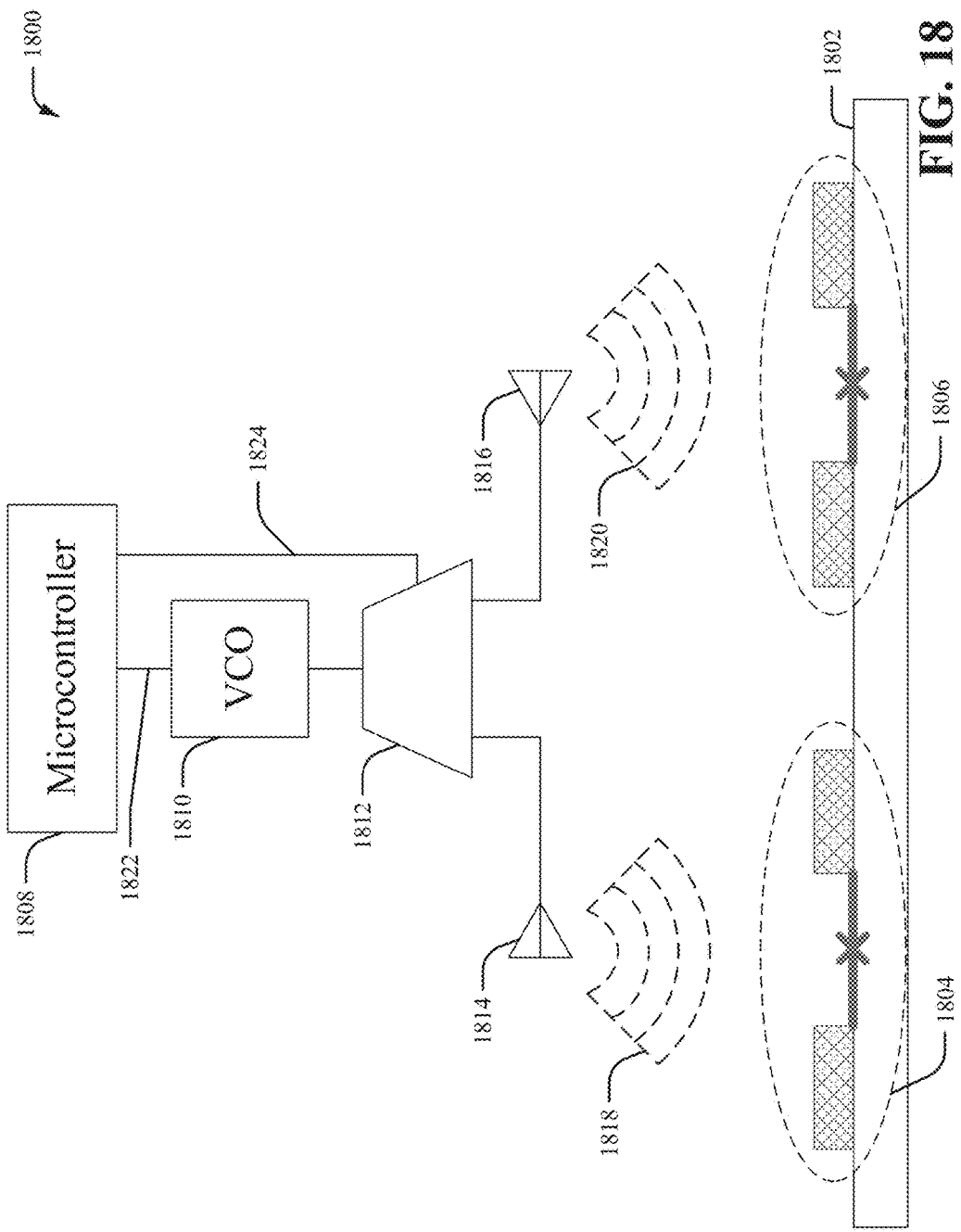
FIG. 18 illustrates a schematic of an example, non-limiting system that facilitates antenna-based qubit annealing using a multiplexer or demultiplexer in accordance with one or more embodiments described herein.

Now, consider FIG. 18. FIG. 18 illustrates a schematic of an example, non-limiting system that facilitates antenna-based qubit annealing using a multiplexer or demultiplexer in accordance with one or more embodiments described herein.

As shown, the system 1800 can comprise a superconducting qubit chip 1802 having one or more qubits 1804 and 1806 with one or more Josephson junctions. The system 1800 can further include a microcontroller 1808 to control annealing of the one or more Josephson junctions of the one or more qubits 1804 and 1806, a voltage-controlled oscillator (VCO) 1810 driven by the microcontroller 1808, and a multiplexer or demultiplexer 1812 coupled to the VCO 1810. Additionally, the system 1800 can have one or more antennas 1814 and 1816. In various embodiments, the microcontroller 1808 can signal the VCO 1810 to generate an electromagnetic wave that is fed by the demultiplexer 1812 to the one or more antennas 1814 and 1816. The one or more antennas can then direct the electromagnetic wave (e.g., signals 1818 and 1820) toward the one or more Josephson junctions, thereby annealing the one or more Josephson junctions. In these one or more embodiments, serial antenna annealing of qubits can be performed without having a dedicated VCO for each antenna. In such case, each antenna 1814 and 1816 can sequentially emit/direct the electromagnetic signal generated by the VCO 1810 (e.g., such that signal 1818 is emitted first and has a same and/or different frequency, duration, and/or magnitude than signal 1820). This can minimize chip area required for VCOs.

In one or more embodiments, a wavelength of the electromagnetic wave can be approximately four times a length of one or more capacitor pads of the one or more qubits.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 19:
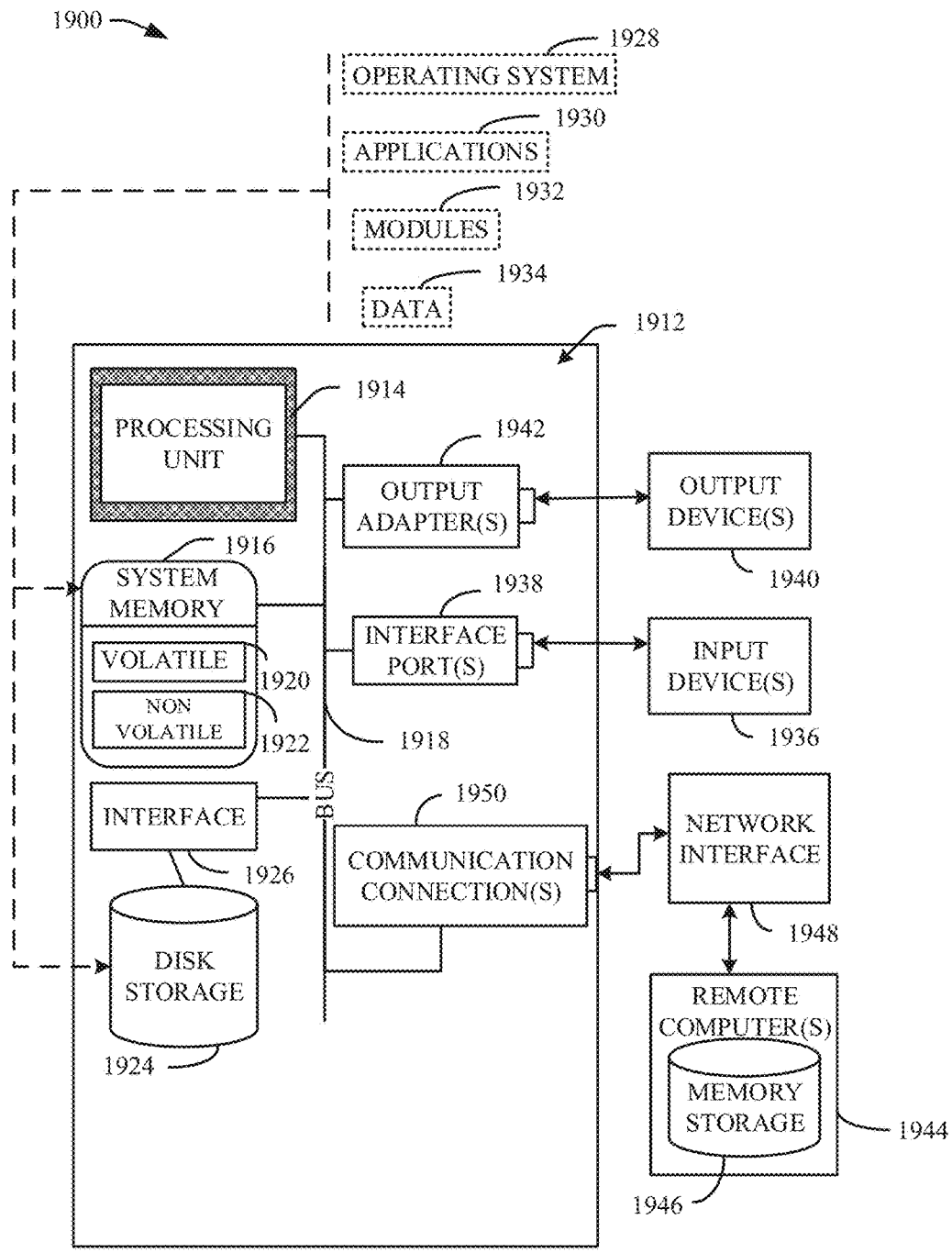
FIG. 19 illustrates a block diagram of an example, non-limiting operating environment in which one or more embodiments described herein can be facilitated.

In order to provide a context for the various aspects of the disclosed subject matter, FIG. 19 as well as the following discussion are intended to provide a general description of a suitable environment in which the various aspects of the disclosed subject matter can be implemented. FIG. 19 illustrates a block diagram of an example, non-limiting operating environment in which one or more embodiments described herein can be facilitated. Repetitive description of like elements employed in other embodiments described herein is omitted for sake of brevity. With reference to FIG. 19, a suitable operating environment 1900 for implementing various aspects of this disclosure can also include a computer 1912. The computer 1912 can also include a processing unit 1914, a system memory 1916, and a system bus 1918. The system bus 1918 couples system components including, but not limited to, the system memory 1916 to the processing unit 1914. The processing unit 1914 can be any of various available processors. Dual microprocessors and other multiprocessor architectures also can be employed as the processing unit 1914. The system bus 1918 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1916 can also include volatile memory 1920 and nonvolatile memory 1922. The basic input/output system (BIOS), containing the basic routines to transfer information between elements within the computer 1912, such as during start-up, is stored in nonvolatile memory 1922. By way of illustration, and not limitation, nonvolatile memory 1922 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1920 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1912 can also include removable/non-removable, volatile/non-volatile computer storage media. FIG. 19 illustrates, for example, a disk storage 1924. Disk storage 1924 can also include, but is not limited to, devices like a magnetic disk drive, floppy disk drive, tape drive, Jaz drive, Zip drive, LS-100 drive, flash memory card, or memory stick. The disk storage 1924 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1924 to the system bus 1918, a removable or non-removable interface is typically used, such as interface 1926. FIG. 19 also depicts software that acts as an intermediary between users and the basic computer resources described in the suitable operating environment 1900. Such software can also include, for example, an operating system 1928. Operating system 1928, which can be stored on disk storage 1924, acts to control and allocate resources of the computer 1912. System applications 1930 take advantage of the management of resources by operating system 1928 through program modules 1932 and program data 1934, e.g., stored either in system memory 1916 or on disk storage 1924. It is to be appreciated that this disclosure can be implemented with various operating systems or combinations of operating systems. A user enters commands or information into the computer 1912 through input device(s) 1936. Input devices 1936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1914 through the system bus 1918 via interface port(s) 1938. Interface port(s) 1938 include, for example, a serial port, a parallel port, a game port, and a universal serial bus (USB). Output device(s) 1940 use some of the same type of ports as input device(s) 1936. Thus, for example, a USB port can be used to provide input to computer 1912, and to output information from computer 1912 to an output device 1940. Output adapter 1942 is provided to illustrate that there are some output devices 1940 like monitors, speakers, and printers, among other output devices 1940, which require special adapters. The output adapters 1942 include, by way of illustration and not limitation, video and sound cards that provide a means of connection between the output device 1940 and the system bus 1918. It should be noted that other devices and/or systems of devices provide both input and output capabilities such as remote computer(s) 1944.

Computer 1912 can operate in a networked environment using logical connections to one or more remote computers, such as remote computer(s) 144. The remote computer(s) 1944 can be a computer, a server, a router, a network PC, a workstation, a microprocessor based appliance, a peer device or other common network node and the like, and typically can also include many or all of the elements described relative to computer 1912. For purposes of brevity, only a memory storage device 1946 is illustrated with remote computer(s) 1944. Remote computer(s) 1944 is logically connected to computer 1912 through a network interface 1948 and then physically connected via communication connection 1950. Network interface 1948 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1950 refers to the hardware/software employed to connect the network interface 1948 to the system bus 1918. While communication connection 1950 is shown for illustrative clarity inside computer 1912, it can also be external to computer 1912. The hardware/software for connection to the network interface 1948 can also include, for exemplary purposes only, internal and external technologies such as, modems including regular telephone grade modems, cable modems and DSL modems, ISDN adapters, and Ethernet cards.

The present invention may be a system, a computer-implemented method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, computer-implemented methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A system, comprising:
   a superconducting qubit chip having a first qubit with a first Josephson junction and a first set of one or more capacitor pads;
   a semiconductor chip positioned above the superconducting qubit chip;
   a first radio frequency (RF) emitter on the semiconductor chip, comprising:
     a first voltage-controlled oscillator; and
     a first antenna driven by the first voltage-controlled oscillator; and
   a microcontroller on the semiconductor chip and that signals the first voltage-controlled oscillator to generate a first electromagnetic wave, which the first antenna directs toward the first set of one or more capacitor pads of the first qubit, thereby annealing the first Josephson junction of the first qubit.

2. The system of claim 1, further comprising:
   a second RF emitter on the semiconductor chip, comprising a second voltage-controlled oscillator and a second antenna, which the microcontroller signals to generate and direct a second electromagnetic wave toward a second set of one or more capacitor pads of a second qubit on the superconducting qubit chip, thereby annealing a second Josephson junction of the second qubit.

3. The system of claim 2, wherein the first voltage-controlled oscillator and the second voltage-controlled oscillator are individually voltage and frequency tunable.

4. The system of claim 1, wherein the semiconductor chip employs a bipolar-junction and complementary metal-oxide semiconductor stack construction.

5. The system of claim 4, wherein the first voltage-controlled oscillator is fabricated in a bipolar-junction transistor portion of the semiconductor chip, the microcontroller is fabricated in a complementary metal-oxide semiconductor portion of the semiconductor chip, and the first antenna is fabricated in a top far-back-end-of-line portion of the semiconductor chip.

6. The system of claim 1, further comprising:
   a digital-to-analog converter that receives and converts a digital signal from the microcontroller to yield an analog signal; and
   a voltage regulator that feeds the analog signal to the first voltage-controlled oscillator, wherein the analog signal controls at least one of a duration, a frequency, or a magnitude of the first electromagnetic wave to achieve a defined level of the annealing of the first Josephson junction of the first qubit.

7. The system of claim 1, further comprising:
   a direct-current-to-direct-current (DC-DC) converter that receives and converts a digital signal from the microcontroller to yield a converted DC signal; and
   a voltage regulator that feeds the converted DC signal to the first voltage-controlled oscillator, wherein the converted DC signal controls at least one of a duration, a frequency, or a magnitude of the first electromagnetic wave to achieve a defined level of the annealing of the first Josephson junction of the first qubit.

8. The system of claim 1, further comprising:
   a voltage regulator that feeds a pulse-width modulated signal from the microcontroller to the first voltage-controlled oscillator, wherein the pulse-width modulated signal controls at least one of a duration, a frequency, or a magnitude of the first electromagnetic wave to achieve a defined level of the annealing of the first Josephson junction of the first qubit.

9. The system of claim 1, further comprising at least one of a low-noise amplifier or an RF filter, electrically coupled in series between the first voltage-controlled oscillator and the first antenna.

10. The system of claim 1, wherein a wavelength of the first electromagnetic wave is approximately four times a length of a capacitor pad of the first set of one or more capacitor pads of the first qubit.

\* \* \* \* \*